(12) United States Patent
Takahashi et al.

(10) Patent No.: US 10,189,366 B2
(45) Date of Patent: Jan. 29, 2019

(54) BATTERY SYSTEM

(71) Applicant: TOYOTA JIDOSHA KABUSHIKI KAISHA, Toyota-shi, Aichi-ken (JP)

(72) Inventors: Kenji Takahashi, Toyota (JP); Hiroyuki Kaiya, Toyota (JP); Chihaya Todoroki, Nisshin (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 400 days.

(21) Appl. No.: 14/783,268

(22) PCT Filed: Apr. 11, 2013

(86) PCT No.: PCT/JP2013/002482
§ 371 (c)(1),
(2) Date: Oct. 8, 2015

(87) PCT Pub. No.: WO2014/167602
PCT Pub. Date: Oct. 16, 2014

(65) Prior Publication Data
US 2016/0052419 A1 Feb. 25, 2016

(51) Int. Cl.
| | | |
|---|---|---|
| *H01M 10/0525* | (2010.01) | |
| *H01M 10/42* | (2006.01) | |
| *H01M 10/48* | (2006.01) | |
| *B60L 11/18* | (2006.01) | |
| *H01M 10/052* | (2010.01) | |
| *H02J 7/00* | (2006.01) | |
| *G01R 31/36* | (2006.01) | |

(52) U.S. Cl.
CPC ....... *B60L 11/1861* (2013.01); *H01M 10/052* (2013.01); *H01M 10/0525* (2013.01); *H01M 10/425* (2013.01); *H01M 10/48* (2013.01); *H02J 7/0052* (2013.01); *G01R 31/3651* (2013.01); *H01M 2010/4278* (2013.01); *H01M 2220/20* (2013.01); *Y02T 10/7011* (2013.01)

(58) Field of Classification Search
CPC . H01M 2010/4271; H01M 2010/4278; H01M 10/48; B60L 11/1861
See application file for complete search history.

(56) References Cited

U.S. PATENT DOCUMENTS

| | | |
|---|---|---|
| 2010/0085057 A1 | 4/2010 | Nishi et al. |
| 2011/0012604 A1 | 1/2011 | Tsujiko et al. |

FOREIGN PATENT DOCUMENTS

| | | |
|---|---|---|
| JP | 2008-243373 A | 10/2008 |
| JP | 2009-210477 A | 9/2009 |
| JP | 2010-257984 A | 11/2010 |

*Primary Examiner* — Stephan J Essex
(74) *Attorney, Agent, or Firm* — Sughrue Mion, PLLC

(57) ABSTRACT

[Task] To accurately estimate a distribution of concentration of lithium in an active material.
[Means for Solution] A battery system has a lithium-ion secondary battery (1) and a controller (300). The lithium-ion secondary battery (1) employs a two-phase coexistence type positive electrode active material (141b). The controller (300) calculates a distribution of concentration of lithium in an active material (141b, 142b) of the lithium-ion secondary battery, through the use of a diffusion equation in which a boundary condition is set. The controller corrects a diffusion coefficient that is used in the diffusion equation, in accordance with history data indicating a charge/discharge state of the lithium-ion secondary battery to the present time.

9 Claims, 10 Drawing Sheets

FIG. 4

| | |
|---|---|
| $C_{cj}$ | CONCENTRATION OF LITHIUM IONS IN ELECTROLYTIC SOLUTION |
| $C_{sj}$ | CONCENTRATION OF LITHIUM IONS IN ACTIVE MATERIAL |
| $C_{sj,\,max}$ | CRITICAL CONCENTRATION OF LITHIUM IONS |
| $C_{scj}$ | CONCENTRATION OF LITHIUM IONS ON INTERFACE OF ACTIVE MATERIAL |
| $\phi_{cj}$ | POTENTIAL OF ELECTROLYTIC SOLUTION |
| $\phi_{sj}$ | POTENTIAL OF ACTIVE MATERIAL |
| T | ABSOLUTE TEMPERATURE |
| $J_j^{Li}$ | GENERATION AMOUNT OF LITHIUM IONS PER UNIT VOLUME AND UNIT TIME (REACTION CURRENT DENSITY), $I = \int j_j^{Li} dv$ |
| $\alpha_{sj}$ | TRANSFER COEFFICIENT OF ELECTRODE REACTION $J_j^{Li}$ (OXIDATION REACTION) |
| $\alpha_{cj}$ | TRANSFER COEFFICIENT OF ELECTRODE REACTION $J_j^{Li}$ (REDUCTION REACTION), $\alpha_{sj} + \alpha_{cj} = 1$ |
| F | FARADAY CONSTANT |
| $i_{oj}$ | EXCHANGE CURRENT DENSITY |
| $\eta_j$ | OVERVOLTAGE OF ELECTRODE REACTION $J_j^{Li}$ |
| $U_j$ | OPEN-CIRCUIT VOLTAGE (OCV: Open Circuit Voltage) |
| $\theta_j$ | LOCAL SOC ON INTERFACE OF ACTIVE MATERIAL, $\theta_j = \dfrac{C_{sej}}{C_{sj,\,max}}$ |
| $R_f$ | FILM RESISTANCE OF SURFACE OF ELECTRODE |
| $t_l^0$ | TRANSPORT NUMBER OF LITHIUM IONS |
| $D_{sj}$ | DIFFUSION COEFFICIENT OF ACTIVE MATERIAL |
| $D_{cj}^{eff}$ | EFFECTIVE DIFFUSION COEFFICIENT OF ELECTROLYTIC SOLUTION |
| $a_{sj}$ | SURFACE AREA OF ACTIVE MATERIAL PER UNIT VOLUME OF ELECTRODE |
| $r_{sj}$ | RADIUS OF ACTIVE MATERIAL |
| $\varepsilon_{sj}$ | VOLUME FRACTION (ACTIVE MATERIAL) $\varepsilon_s + \varepsilon_c + \varepsilon_p + \varepsilon_f = 1$ |
| $\varepsilon_{cj}$ | VOLUME FRACTION (ELECTROLYTIC SOLUTION) |
| $K_j^{eff}$ | EFFECTIVE ION CONDUCTIVITY OF ELECTROLYTIC SOLUTION |
| $K_{Dj}^{eff}$ | DIFFUSION CONDUCTIVITY OF ELECTROLYTIC SOLUTION |
| $\sigma_j^{eff}$ | EFFECTIVE CONDUCTIVITY OF ACTIVE MATERIAL |
| I | CURRENT DENSITY (PER UNIT SURFACE AREA OF POLE PLATE) |
| $L_j$ | THICKNESS OF ELECTRODE |

BATTERY SYSTEM

TECHNICAL FIELD

The invention relates to an art of estimating an internal state of a lithium-ion secondary battery.

BACKGROUND ART

In Patent Document 1, an internal state of a lithium-ion secondary battery is estimated by providing for a battery model. The internal state is a distribution of concentration of lithium in an active material model, and the distribution of concentration of lithium is calculated through the use of a diffusion equation.

RELATED TECHNICAL DOCUMENT

Patent Document

Patent Document 1: Japanese Patent Application Publication No. 2008-243373 (JP 2008-243373 A)

SUMMARY OF THE INVENTION

Problem to be Solved by the Invention

In a lithium-ion secondary battery, a so-called two-phase coexistence type positive electrode active material may be employed. It should be noted herein that the performance of the secondary battery employing the two-phase coexistence type positive electrode active material changes in accordance with the charge/discharge state in the past (which is referred to as the charge/discharge history). In Patent Document 1, the change in the performance of the battery resulting from the charge/discharge history is not taken into account at all in estimating the internal state of the secondary battery.

Means for Solving the Problem

A battery system as the first invention of the present application has a lithium-ion secondary battery and a controller. The lithium-ion secondary battery employs a two-phase coexistence type positive electrode active material. The controller calculates a distribution of concentration of lithium in the active material in the lithium-ion secondary battery, through the use of a diffusion equation in which a boundary condition is set. Besides, the controller corrects a diffusion coefficient that is used in the diffusion equation, in accordance with history data indicating a charge/discharge state of the lithium-ion secondary battery to the present time.

In the lithium-ion secondary battery that employs the two-phase coexistence type positive electrode active material, even in the case where the lithium-ion secondary battery is discharged or charged from an arbitrary state of charge (an arbitrary SOC), the performance (the internal resistance) of the battery changes in accordance with the charge/discharge state until the attainment of the arbitrary SOC. This change in the performance of the battery depends on the diffusion resistance of the lithium-ion secondary battery. Therefore, the diffusion coefficient that is used in the diffusion equation can be corrected in accordance with the history data.

By correcting the diffusion coefficient in accordance with the history data, the aforementioned change in the performance of the battery can be reflected by the distribution of concentration of lithium that is calculated from the diffusion equation. Thus, the distribution of concentration of lithium in the active material can be accurately estimated as to the lithium-ion secondary battery whose performance changes in accordance with the charge/discharge state in the past.

In correcting the diffusion coefficient, a reference value of the diffusion coefficient can be multiplied by a correction coefficient corresponding to the history data. It should be noted herein that if a corresponding relationship between the history data and the correction coefficient is obtained in advance, the correction coefficient corresponding to the present history data in the lithium-ion secondary battery can be calculated.

The history data can be stored into a memory. Thus, the diffusion coefficient can be corrected by referring to the history data stored in the memory. In storing the history data into the memory, the history data stored in the memory can be updated every time the lithium-ion secondary battery is charged or discharged. Concretely, newly acquired history data can be stored into the memory, and the oldest history data can be erased from the memory. Thus, the history data can be stored into the memory in consideration of the storage capacity of the memory.

As the history data, it is possible to use a variation in the SOC of the lithium-ion secondary battery in a predetermined period to the present time, or an average current value of the lithium-ion secondary battery in the predetermined period. When the lithium-ion secondary battery is charged or discharged, the SOC of the lithium-ion secondary battery changes, so the charge/discharge state to the present time can be grasped based on the variation in the SOC. It should be noted herein that a difference between a maximum value of the SOC in the predetermined period and a minimum value of the SOC in the predetermined period can be used as the variation in the SOC.

Besides, when the lithium-ion secondary battery is charged or discharged, the current value of the lithium-ion secondary battery changes. For example, a positive value can be used as the current value at the time when the lithium-ion secondary battery is discharged, and a negative value can be used as the current value at the time when the lithium-ion secondary battery is charged. In this case, the sign (plus or minus) of the current value changes as the lithium-ion secondary battery is charged or discharged. Accordingly, the charge/discharge state to the present time can be grasped based on the current value of the lithium-ion secondary battery. When the current value is likely to change, the average current value can be calculated.

The reference value of the diffusion coefficient depends on the temperature of the lithium-ion secondary battery. Therefore, if a corresponding relationship between the temperature of the battery and the diffusion coefficient (the reference value) is obtained in advance, the temperature of the lithium-ion secondary battery is detected to make it possible to calculate the diffusion coefficient (the reference value) corresponding to this detected temperature. It should be noted herein that the temperature of the lithium-ion secondary battery can be detected through the use of a temperature sensor. Besides, the diffusion coefficient (the reference value) depends on the SOC of the lithium-ion secondary battery. Therefore, if a corresponding relationship between the SOC and the diffusion coefficient (the reference value) is obtained in advance, the SOC of the lithium-ion secondary battery is estimated to make it possible to calculate the diffusion coefficient (the reference value) corresponding to this SOC.

It should be noted herein that the SOC of the lithium-ion secondary battery can be calculated based on the distribution of concentration of lithium in the active material. Concretely, the average concentration of lithium in the active material can be calculated by first calculating the distribution of concentration of lithium in the active material. It should be noted herein that if a corresponding relationship between the average concentration and the SOC is obtained in advance, the SOC can be calculated (estimated) by calculating the average concentration. As described above, the accuracy in estimating the SOC can be enhanced by accurately estimating the distribution of concentration of lithium.

If a plurality of lithium-ion secondary batteries are employed, an assembled battery can be constructed. It should be noted herein that the plurality of the lithium-ion secondary batteries can be connected in series to one another. Besides, discharge circuits can be connected in parallel to the lithium-ion secondary batteries respectively. When one of the discharge circuits is operated, only the lithium-ion secondary battery corresponding to this discharge circuit can be discharged.

The discharge circuits can be employed to restrain the voltage values (OCV's) or the SOC's of the plurality of the lithium-ion secondary batteries from dispersing. Concretely, the lithium-ion secondary batteries whose voltage value is on the higher side are discharged by the discharge circuits respectively, so the voltage value of the discharged lithium-ion secondary batteries can be made equal to the voltage value of the other lithium-ion secondary batteries.

When the assembled battery is charged or discharged, all the lithium-ion secondary batteries constituting the assembled battery are charged or discharged. On the other hand, when a specific one of the discharge circuits is operated, only the lithium-ion secondary battery corresponding to this discharge circuit is discharged. In this case, it is preferable to correct the diffusion coefficient in consideration of the discharge state, as to the discharged lithium-ion secondary battery. It should be noted herein that the variation in voltage at the time when the lithium-ion secondary batteries are discharged can be used as the history data.

The lithium-ion secondary battery can be mounted in the vehicle. If the output electric power of the lithium-ion secondary battery is converted into kinetic energy, the vehicle can be caused to run through the use of this kinetic energy. On the other hand, if the kinetic energy that is generated in braking the vehicle is converted into an electric power, the lithium-ion secondary battery can be charged through the use of this electric power (this regenerative electric power).

A battery system as the second invention of the present application has a lithium-ion secondary battery and a controller. The lithium-ion secondary battery employs a two-phase coexistence type positive electrode active material. The controller estimates an internal resistance of the lithium-ion secondary battery. It should be noted herein that the controller corrects a reference value of the internal resistance, in accordance with history data indicating a charge/discharge state of the lithium-ion secondary battery to the present time.

As described above, in the lithium-ion secondary battery that employs the two-phase coexistence type positive electrode active material, the performance (the internal resistance) of the battery changes due to an influence of the charge/discharge state to the present time. Thus, the present internal resistance of the lithium-ion secondary battery can be estimated in consideration of the charge/discharge state to the present time. Concretely, the reference value of the internal resistance is determined, and the internal resistance (the reference value) can be corrected in accordance with the history data.

As a method of correcting the internal resistance (the reference value) as well as a method of correcting the diffusion coefficient, for example, the internal resistance (the reference value) can be multiplied by a correction coefficient. It should be noted herein that the internal resistance (the reference value) depends on the temperature and the SOC of the lithium-ion secondary battery. Therefore, if a corresponding relationship between at least one of the temperature and the SOC and the internal resistance (the reference value) is obtained in advance, the internal resistance (the reference value) can be calculated by specifying the temperature or the SOC.

On the other hand, the correction coefficient by which the internal resistance (the reference value) is multiplied may be changed in accordance with the history data. Concretely, if a corresponding relationship between the correction coefficient and the history data is obtained in advance, the correction coefficient can be calculated by specifying the history data. As described above, the variation in the SOC and the average current value can be used as the history data.

BRIEF DESCRIPTION OF THE DRAWINGS

FIG. 4 is a view showing a list of variables and the like that are used in battery model expressions.

MODES FOR CARRYING OUT THE INVENTION

The embodiments of the invention will be described hereinafter.

First Embodiment

Figure 1:
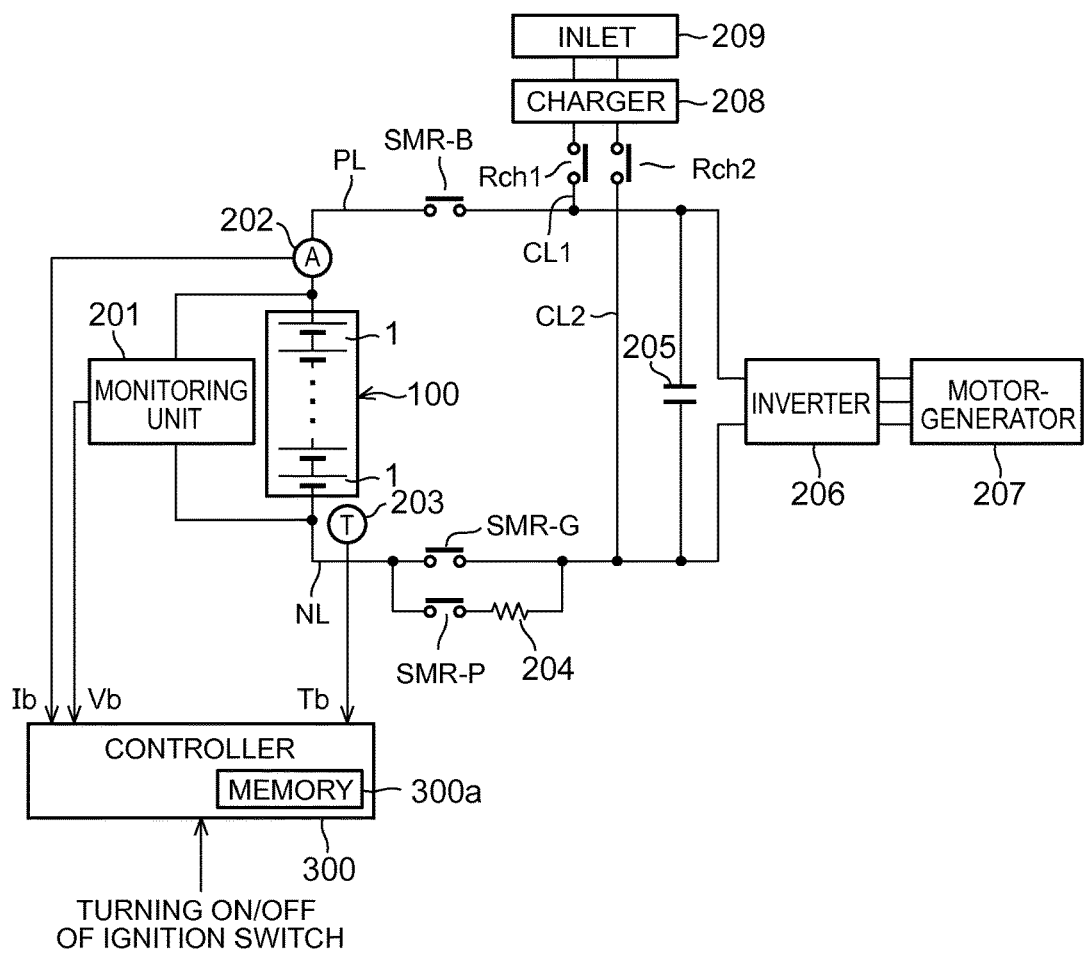
FIG. 1 is a view showing the configuration of a battery system.

FIG. 1 is a view showing the configuration of a battery system of the present embodiment of the invention. The battery system shown in FIG. 1 can be mounted in a vehicle. The vehicle may be a hybrid vehicle (an HV), a plug-in hybrid vehicle (a PHV), or an electric vehicle (an EV). In the present embodiment of the invention, a case where the battery system shown in FIG. 1 is mounted in the PHV will be described.

In addition to an assembled battery that will be described later, the HV is equipped with another motive power source such as an engine or a fuel cell, as motive power sources for causing the vehicle to run. In the PHV, the assembled battery can be charged through the use of an electric power from an external electric power supply in the HV. The EV is equipped with only the assembled battery that will be described later, as a motive power source of the vehicle. By being supplied with an electric power from the external electric power supply, the EV can charge the assembled battery. The external electric power supply is an electric power supply (e.g., a commercial electric power supply) that is provided separately from the vehicle outside the vehicle.

An assembled battery 100 has a plurality of secondary batteries 1 that are connected in series to one another. Lithium-ion secondary batteries can be employed as the secondary batteries 1. The number of secondary batteries 1 constituting the assembled battery 100 can be appropriately set based on a required output and the like of the assembled battery 100. Besides, the assembled battery 100 can also include a plurality of the secondary batteries 1 that are connected in parallel to one another.

Each of the secondary batteries 1 has a battery case, and an electric power generation element that is accommodated in the battery case. The electric power generation element is an element that carries out charge/discharge, and has a positive electrode (which will be also referred to as an electrode), a negative electrode (which will be also referred to as an electrode), and a separator that is arranged between the positive electrode and the negative electrode. Incidentally, a solid electrolyte can also be employed instead of the separator.

The positive electrode has a current collector, and a positive electrode active material layer that is formed on a surface of the current collector. The current collector of the positive electrode can be formed of, for example, aluminum. The positive electrode active material layer includes, for example, a positive electrode active material, a binding agent, and a conductive assistant. For example, polyvinylidene fluoride can be employed as the binding agent. For example, acetylene black can be employed as the conductive assistant.

The negative electrode has a current collector, and a negative electrode active material layer that is formed on a surface of the current collector. The current collector of the negative electrode can be formed of, for example, copper. The negative electrode active material layer includes, for example, a negative electrode active material, a biding agent, and a thickener. A known material can be appropriately selected as the material constituting the negative electrode active material layer. It should be noted herein that, for example, a natural graphite-type carbon material can be employed as the negative electrode active material.

A monitoring unit 201 detects a voltage value of the assembled battery 100, and detects a voltage value Vb of each of the secondary batteries 1. The monitoring unit 201 outputs detected results to a controller 300. A current sensor 202 detects a current value Ib of a current flowing through the assembled battery 100, and outputs a detected result to the controller 300. In the present embodiment of the invention, the current value Ib at the time when the assembled battery 100 is discharged is a positive value, and the current value Ib at the time when the assembled battery 100 is charged is a negative value. A temperature sensor 203 detects a temperature Tb of the assembled battery 100 (the secondary batteries 1), and outputs a detected result to the controller 300. If a plurality of temperature sensors 203 are employed, the temperature Tb of each of the secondary batteries 1 that are arranged at mutually different positions is easy to detect.

The controller 300 has a memory 300a. Various pieces of information for allowing the controller 300 to execute a predetermined processing (e.g., a processing that will be described in the present embodiment of the invention) are stored in the memory 300a. In the present embodiment of the invention, the memory 300a is built in the controller 300. However, the memory 300a can also be provided outside the controller 300. When the memory 300a is provided outside the controller 300, the controller 300 can read out the information stored in the memory 300a with or without the aid of wires.

A positive electrode line PL that is connected to a positive electrode terminal of the assembled battery 100 is provided with a system main relay SMR-B. By receiving a control signal from the controller 300, the system main relay SMR-B turns on and off. A negative electrode line NL that is connected to a negative electrode terminal of the assembled battery 100 is provided with a system main relay SMR-G. By receiving a control signal from the controller 300, the system main relay SMR-G turns on and off.

A system main relay SMR-P and a resistance element 204 are connected in parallel to the system main relay SMR-G. The system main relay SMR-P and the resistance element 204 are connected in series to each other. By receiving a control signal from the controller 300, the system main relay SMR-P turns on and off.

The resistance element 204 is employed to restrain a rush current from flowing through a capacitor 205 in connecting the assembled battery 100 to a load (concretely, an inverter 206). The capacitor 205 is connected to the positive electrode line PL and the negative electrode line NL, and is employed to smoothen fluctuations in the voltage between the positive electrode line PL and the negative electrode line NL.

In connecting the assembled battery 100 to the inverter 206, the controller 300 first turns on the system main relay SMR-B from its off state, and turns on the system main relay SMR-P from its off state. Thus, a current flows through the resistance element 204.

Subsequently, the controller 300 turns on the system main relay SMR-G from its off state, and turns off the system main relay SMR-P from its on state. Thus, the connection of the assembled battery 100 to the inverter 206 is completed, and the battery system shown in FIG. 1 assumes an activated (Ready-On) state. Information on the on/off state of an ignition switch of the vehicle is input to the controller 300. The controller 300 activates the battery system shown in FIG. 1 as the ignition switch turns on from its off state.

On the other hand, when the ignition switch turns off from its on state, the controller 300 turns off the system main relays SMR-B and SMR-G from their on state. Thus, the assembled battery 100 and the inverter 206 are disconnected from each other, and the battery system shown in FIG. 1 assumes a stopped (Ready-Off) state.

The inverter 206 converts a direct-current electric power from the assembled battery 100 into an alternating-current electric power, and outputs the alternating-current electric power to a motor-generator 207. For example, a three-phase alternating-current motor can be employed as the motor-generator 207. Upon receiving the alternating-current electric power from the inverter 206, the motor-generator 207 generates kinetic energy for causing the vehicle to run. The kinetic energy that is generated by the motor-generator 207 is transmitted to wheels, and can cause the vehicle to run.

In decelerating or stopping the vehicle, the motor-generator 207 converts the kinetic energy that is generated in braking the vehicle, into electric energy (an alternating-current electric power). The inverter 206 converts the alternating-current electric power that is generated by the motor-generator 207, into a direct-current electric power, and outputs this direct-current electric power to the assembled battery 100. Thus, a regenerative electric power can be stored into the assembled battery 100.

In the present embodiment of the invention, the assembled battery 100 is connected to the inverter 206, but the invention should not be limited thereto. Concretely, a current path between the assembled battery 100 and the inverter 206 can be provided with a booster circuit. By employing the booster circuit, the output voltage of the assembled battery 100 can be stepped up. Besides, the booster circuit can step down the output voltage from the inverter 206 to the assembled battery 100.

A charger 208 is connected to the positive electrode line PL and the negative electrode line NL via charge lines CL1 and CL2 respectively. The charge lines CL1 and CL2 are provided with charge relays Rch1 and Rch2 respectively. Upon receiving a control signal from the controller 30, each of the charge relays Rch1 and Rch2 turns on and off. An inlet (a so-called connector) 209 is connected to the charger 208. A plug (a so-called connector) that is installed outside the vehicle is connected to the inlet 209.

The plug is connected to an external electric power supply. By connecting the plug to the inlet 209, the electric power from the external electric power supply can be supplied to the assembled battery 100 via the charger 208. Thus, the assembled battery 100 can be charged through the use of the electric power from the external electric power supply. The charge of the assembled battery 100 through the use of the external electric power supply is referred to as external charge.

When the external electric power supply supplies an alternating-current electric power, the charger 208 converts the alternating-current electric power from the external electric power supply into a direct-current electric power, and supplies this direct-current electric power to the assembled battery 100. Besides, in carrying out external charge, the charger 208 can also convert a voltage. In the present embodiment of the invention, the charger 208 is mounted in the vehicle. However, the charger can also be installed outside the vehicle. Besides, wires can be employed or dispensed with in a path through which the electric power from the external electric power supply is supplied to the assembled battery 100. In the case where wires are dispensed with, a noncontact-type charge system that utilizes electromagnetic induction and resonance phenomena can be employed. A known configuration can be appropriately selected as the noncontact-type charge system.

In the present embodiment of the invention, external charge can be carried out by turning on the system main relays SMR-B and SMR-G and turning on the charge relays Rch1 and Rch2. It should be noted herein that the charge lines CL1 and CL2 can be directly connected to the positive electrode terminal and the negative electrode terminal of the assembled battery 100. In this case, external charge can be carried out simply by turning on the charge relays Rch1 and Rch2. It should be noted herein that the charge lines CL1 and CL2 may partially overlap with the lines PL and NL respectively.

In each of the secondary batteries 1 of the present embodiment of the invention, a two-phase coexistence type positive electrode active material is employed. The two-phase coexistence type positive electrode active material is an active material that allows two phases (a first phase and a second phase) to stably coexist. The first phase is a state where lithium ions are inserted in the positive electrode active material. The second phase is a state where lithium ions are discharged from the positive electrode active material. The two-phase coexistence type positive electrode active material is a compound containing lithium. For example, a spinel compound containing Ni and Mn, or an olivine compound containing Fe ($LiFePO_4$ or the like) can be employed as this positive electrode active material.

When each of the secondary batteries 1 is completely discharged, the entire positive electrode active material is in the first phase. When each of the secondary batteries 1 is fully charged, the entire positive electrode active material is in the second phase. It should be noted herein that when each of the secondary batteries 1 is charged, lithium ions are discharged from a surface (which is also referred to as an interface) of the positive electrode active material, and the positive electrode active material gradually changes from the first phase to the second phase. It should be noted herein that the surface of the positive electrode active material is a boundary (the interface) on which the positive electrode active material and an electrolytic solution are in contact with each other. When each of the secondary batteries 1 is charged, a surface layer of the positive electrode active material changes from the first phase to the second phase. As charge progresses, a change from the first phase to the second phase occurs toward a central layer of the positive electrode active material.

On the other hand, when each of the secondary batteries 1 is discharged, lithium ions are inserted into the surface of the positive electrode active material, and the positive electrode active material changes from the second phase to the first phase. That is, when each of the secondary batteries 1 is discharged, the surface layer of the positive electrode active material first changes from the second phase to the first phase. As discharge progresses, a change from the second phase to the first phase occurs toward the central layer of the positive electrode active material.

In each of the secondary batteries 1 employing the two-phase coexistence type positive electrode active material, it has turned out that the performance of each of the secondary batteries 1 changes in accordance with the past history (the charge/discharge history) at the time when each of the secondary batteries 1 is charged/discharged. Changes in the performance of each of the secondary batteries 1 will be described using FIGS. 2A to 2D.

Figure 2A:
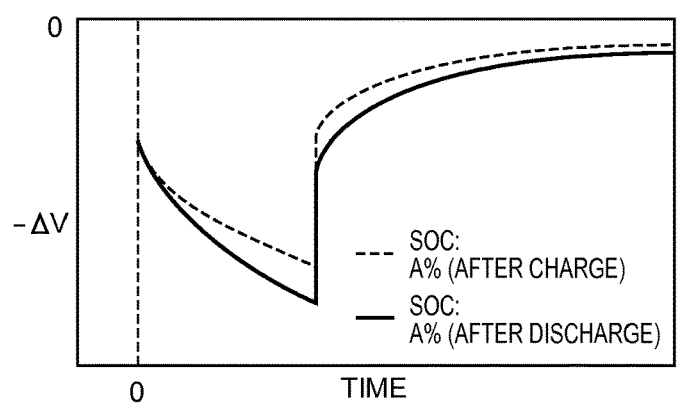
FIG. 2A is a view showing voltage behaviors at the time when secondary batteries whose methods of setting an SOC are different from each other are discharged.
Figure 2B:
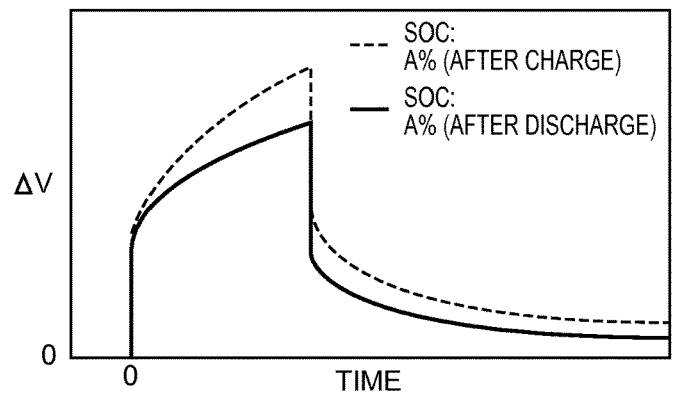
FIG. 2B is a view showing voltage behaviors at the time when secondary batteries whose methods of setting an SOC are different from each other are charged.

FIG. 2A shows a voltage behavior at the time when discharge (pulse discharge in this case) is carried out using each of the secondary batteries 1 when the state of charge (the SOC) is A (A>0) (%). FIG. 2B shows a voltage behavior at the time when charge (pulse charge in this case) is carried out using each of the secondary batteries 1 when the SOC is A (A>0) (%). In FIGS. 2A and 2B, the axis of ordinates represents the variation in voltage resulting from discharge or charge, and the axis of abscissa represents the time. Incidentally, the SOC is the ratio of a present charge capacity to a full charge capacity.

In each of FIGS. 2A and 2B, a dotted line indicates a case where the SOC of the secondary battery 1 is set to A (%) by charging the secondary battery 1, and a solid line indicates a case where the SOC of the secondary battery 1 is set to A (%) by discharging the secondary battery 1. As for the dotted and solid lines shown in FIG. 2A, the current value is the same when pulse discharge is carried out. Besides, as for the dotted and solid lines shown in FIG. 2B, the current value is the same when pulse charge is carried out.

Figure 2C:
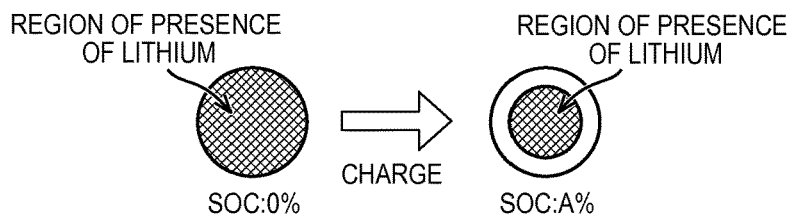
FIG. 2C is a schematic view showing how lithium changes in a positive electrode active material when a secondary battery is charged.

FIG. 2C is a schematic view showing how the internal state of the positive electrode active material changes when the secondary battery 1 is charged. In an example shown in FIG. 2C, the SOC of the secondary battery 1 is changed from 0(%) to A (%) by charging the secondary battery 1. It should be noted herein that the positive electrode active material is regarded as a sphere.

As described above, when the SOC is 0(%), the interior of the positive electrode active material is filled with lithium, and the entire positive electrode active material is in the second phase. It should be noted herein that when the secondary battery 1 is charged, lithium ions are discharged from the surface of the positive electrode active material, and the concentration of lithium in the surface layer of the positive electrode active material falls. In FIG. 2C, a hatched region indicates a region where lithium is present in the positive electrode active material. In other words, a non-hatched region indicates a region where lithium is not present.

Figure 2D:
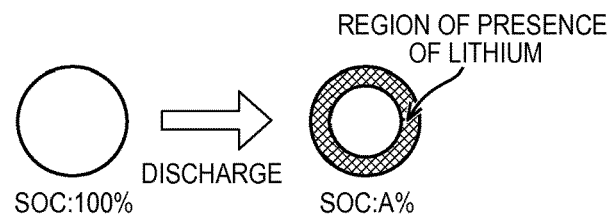
FIG. 2D is a schematic view showing how lithium changes in the positive electrode active material when the secondary battery is discharged.

FIG. 2D is a schematic view showing how the internal state of the positive electrode active material changes when the secondary battery 1 is discharged. In an example shown in FIG. 2D, the SOC of the secondary battery 1 is changed from 100(%) to A (%) by discharging the secondary battery 1.

As described above, when the SOC is 100(%), no lithium is present inside the positive electrode active material, and the entire positive electrode active material is in the first phase. It should be noted herein that when the secondary battery 1 is discharged, lithium is inserted into the surface of the positive electrode active material, and the concentration of lithium in the surface layer of the positive electrode active material increases. In FIG. 2D, a hatched region indicates a region where lithium is present in the positive electrode active material. In other words, a non-hatched region indicates a region where no lithium is present.

As shown in FIGS. 2A and 2B, even when the SOC of the secondary battery 1 is the same, the voltage behavior changes in accordance with the charge/discharge history until the SOC is set to A (%). That is, as described above, the performance of the secondary battery 1 changes in accordance with the charge/discharge history.

Concretely, as shown in FIG. 2A, when pulse discharge is carried out, a voltage variation (an absolute value) $\Delta V$ of the secondary battery 1 whose SOC is set to A (%) through discharge is larger than the voltage variation (an absolute value) $\Delta V$ of the secondary battery 1 whose SOC is set to A (%) through charge. In FIG. 2A, the secondary battery 1 is discharged, so the voltage variation $\Delta V$ assumes a negative value. According to the voltage behavior shown in FIG. 2A, the resistance value of the secondary battery 1 whose SOC is set to A (%) through discharge turns out to be higher than the resistance value of the secondary battery 1 whose SOC is set to A (%) through charge when the secondary battery 1 is discharged.

Besides, as shown in FIG. 2B, when pulse charge is carried out, the voltage variation $\Delta V$ of the secondary battery 1 whose SOC is set to A (%) through charge is larger than the voltage variation $\Delta V$ of the secondary battery 1 whose SOC is set to A (%) through discharge. In FIG. 2B, the secondary battery 1 is charged, so the voltage variation $\Delta V$ assumes a positive value. According to the voltage behavior shown in FIG. 2B, the resistance value of the secondary battery 1 whose SOC is set to A (%) through charge turns out to be higher than the resistance value of the secondary battery 1 whose SOC is set to A (%) through discharge when the secondary battery 1 is charged.

As described above, when the secondary battery 1 is charged/discharged, the resistance value of the secondary battery 1 is influenced by the charge/discharge history to the present time. Concretely, the resistance value of the secondary battery 1 at the time when the past energization state and the present energization state are a discharge state is higher than the resistance value of the secondary battery 1 at the time when the past energization state is a charge state and the present energization state is a discharge state. Besides, the resistance value of the secondary battery 1 at the time when the past energization state and the present energization state are a charge state is higher than the resistance value of the secondary battery 1 at the time when the past energization state is a discharge state and the present energization state is a charge state. In other words, the resistance value of the secondary battery 1 at the time when the past energization state and the present energization state are the same (a charge state or a discharge state) is higher than the resistance value of the secondary battery 1 at the time when the past energization state and the present energization state are different from each other.

The resistance (the internal resistance) of the secondary battery 1 includes a direct-current resistance, a reaction resistance, and a diffusion resistance. The direct-current resistance is a purely electric resistance against the movement of electrons. The reaction resistance is a resistance (a charge transfer resistance) that equivalently operates as an electric resistance when a reaction current is generated on the surface of the active material. The diffusion resistance is a resistance at the time when lithium diffuses inside the active material.

It should be noted herein that voltage fluctuations resulting from the diffusion resistance generally occur at a later timing than voltage fluctuations resulting from the direct-current resistance and the reaction resistance. Immediately after discharge or charge is carried out, the voltage value of the secondary battery 1 changes, but these voltage fluctuations result from the direct-current resistance or the reaction resistance. It should be noted herein that the behavior of the voltage variation ΔV indicated by the dotted line and the behavior of the voltage variation ΔV indicated by the solid line coincide with each other immediately after pulse discharge or pulse charge is carried out as shown in FIG. 2A or FIG. 2B.

On the other hand, as shown in FIGS. 2A and 2, when a certain time elapses after discharge or charge is carried out, the behavior of the voltage variation ΔV indicated by the dotted line deviates from the behavior of the voltage variation ΔV indicated by the solid line. This deviation results from the diffusion resistance whose time constant is longer than those of the direct-current resistance and the reaction resistance.

Thus, in the present embodiment of the invention, when the internal state of the secondary battery 1 is estimated through the use of a battery model that will be described later, the aforementioned influence of the diffusion resistance is taken into account. Concretely, as will be described below, the diffusion coefficient that is used in the battery model is corrected based on the charge/discharge history of the secondary battery 1.

Figure 3:
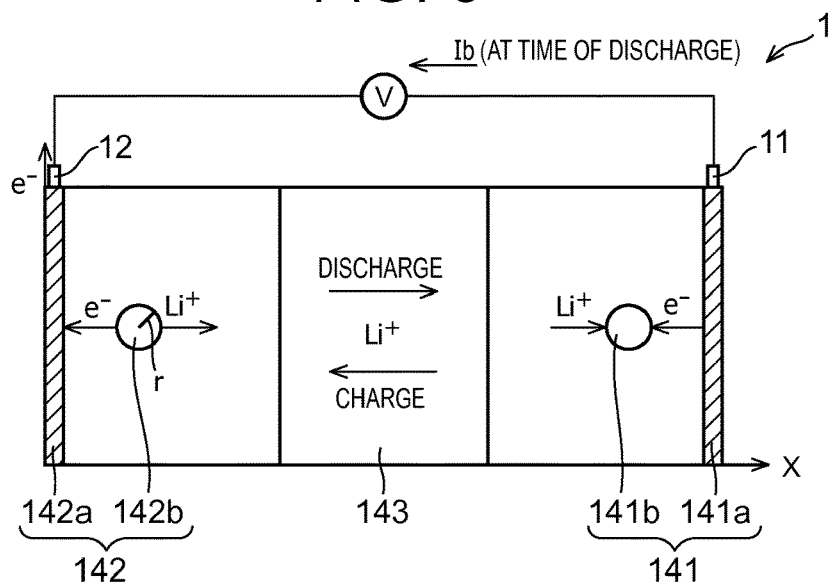
FIG. 3 is a schematic view showing the configuration of the secondary battery.

First of all, the battery model that is employed in the present embodiment of the invention will be described. FIG. 3 is a schematic view showing the configuration of the secondary battery 1. A coordinate axis x shown in FIG. 3 indicates a position in the thickness direction of electrodes.

The secondary battery 1 has a positive electrode 141, a negative electrode 142, and a separator 143. The separator 143 is located between the positive electrode 141 and the negative electrode 142, and includes an electrolytic solution. The positive electrode 141 has a current collector 141a that is constituted of aluminum and the like, and the current collector 141a is electrically connected to a positive electrode terminal 11 of the secondary battery 1. The negative electrode 142 has a current collector 142a that is constituted of copper and the like, and the current collector 142a is electrically connected to a negative electrode terminal 12 of the secondary battery 1.

The negative electrode 142 and the positive electrode 141 are constituted by aggregates of spherical active materials 142b and 141b respectively. In discharging the secondary battery 1, a chemical reaction of emitting lithium ions Li$^+$ and electrons e is caused on an interface of the active material 142b of the negative electrode 142. Besides, a chemical reaction of absorbing lithium ions Li$^+$ and electrons e is caused on an interface of the active material 141b of the positive electrode 141.

On the other hand, in charging the secondary battery 1, reactions reverse to the aforementioned chemical reactions are caused on the interfaces of the active materials 142b and 141b. In this manner, lithium ions Li$^+$ are transferred between the negative electrode 142 and the positive electrode 141 to charge/discharge the secondary battery 1, so a charge current Ib (Ib<0) or a discharge current Ib (Ib>0) is generated. FIG. 3 shows a state where the secondary battery 1 is discharged.

A fundamental battery model expression that is used in the present embodiment of the invention is expressed by fundamental equations made up of expressions (1) to (11) shown below. FIG. 4 shows a list of variables and constants that are used in the battery model expression.

As regards the variables and constants in the model expression that will be described below, those with a subscript e indicate a value in the electrolytic solution, and those with a subscript s indicate a value in the active material. A subscript j is provided to distinguish between the positive electrode and the negative electrode. A value in the positive electrode is meant when j is 1. A value in the negative electrode is meant when j is 2. When the variables or constants in the positive electrode and the negative electrode are comprehensively mentioned, the subscript j is omitted. Besides, the mentioning of (t) indicating a time function, (T) indicating the dependency on the battery temperature Tb, (θ) indicating the dependency on a local SOC θ, or the like may be omitted in the specification. A sign # annexed to the variables or constants represents an average value.

[Mathematical Expressions 1]

$$j_j^{Li}(x,\theta_j,t)/a_{sj} = i_{0j}(x,\theta_j,T,t)\cdot[\exp(\alpha_{aj}F/RT\cdot\eta_j\#(x,\theta_j,t)) - \exp(-\alpha_{cj}F/RT\cdot\eta_j\#(x,\theta_j,t))] \quad (1)$$

$$\eta_j(x,\theta_j,t) = \phi_{sj}(x,t) - \phi_{ej}(x,t) - U_j(x,\theta,t) \quad (2)$$

The aforementioned expressions (1) and (2) are expressions indicating an electrochemical reaction in an electrode (an active material), and are referred to as Butler-Volmer equations.

An expression (3) shown below is established as an expression regarding the conservation law of the concentration of lithium ions in an electrolytic solution. A diffusion equation indicated by an expression (4) shown below and boundary condition expressions indicated by expressions (5) and (6) shown below are applied as expressions regarding the conservation law of the concentration of lithium in the active material. The following expression (5) indicates a boundary condition in a central portion of the active material. The following expression (6) indicates a boundary condition on an interface of the active material (which will be referred to hereinafter simply as "the interface" as well).

The local distribution of lithium (concentration distribution) on the interface of the active material is provided for as the local SOC. It should be noted herein that $\theta_j$ indicating the local SOC is defined by an expression (7) shown below. As indicated by an expression (8) shown below, $c_{sej}$ in the following expression (7) indicates a concentration of lithium on the interface of the active material of each of the positive electrode and the negative electrode. Also, $c_{sj,\,max}$ indicates a critical concentration of lithium in the active material.

[Mathematical Expressions 2]

$$\delta[\varepsilon_{ej}\cdot c_{ej}(x,t)]/\delta t = \nabla\cdot[D_{ej}^{eff}\nabla c_{ej}(x,t)] + 1 - t_+^0/F\cdot j_j^{Li}(x,\theta_j,t) - 1_{ej}\cdot\nabla t_+^0/F \quad (3)$$

$$\partial c_{sj}(x,r_j,t)/\partial t = D_{sj}[\partial^2 c_{sj}/\partial r_j^2 + 2/r_j\cdot\partial c_{sj}/\partial r_j] \quad (4)$$

$$\theta c_{sj}(x,r_j,t)/\partial r|_{r_j=0} = 0 \quad (5)$$

$$\partial[\varepsilon_{sj}\cdot c_{sj}(x,r_j,t)]/\partial t|_{r_j=r_{sj}} = -j_j^{Li}(x,\theta_j,t)/a_{sj}F \quad (6)$$

$$\theta_j = c_{sej}/c_{sj,max} \quad (7)$$

$$c_{sej} = c_{sj}(x,r_{sj},t) \quad (8)$$

An expression (9) shown below is established as an expression regarding the conservation law of electrical charges in the electrolytic solution. An expression (10) shown below is established as an expression regarding the conservation law of electrical charges in the active material. An expression (11) shown below, which indicates a relationship between a current density I(t) and a reaction current density $j_j^{Li}$, is established as an electrochemical reaction expression on the interface of the active material.

[Mathematical Expressions 3]

$$\nabla \cdot [\kappa_j^{e\!f\!f}(x,t) \nabla \phi_{ej}(x,t)] + \nabla \cdot [\kappa_{Dj}^{e\!f\!f}(x,t) \nabla \ln c_{ej}(x,t)] + j_j^{Li}(x,\theta_j,t) = 0 \quad (9)$$

$$\nabla \cdot [\sigma_j^{e\!f\!f}(x,t) \nabla \phi_{sj}(x,t)] - j_j^{Li}(x,\theta_j,t) = 0 \quad (10)$$

$$I(t) = \int_0^{Lj} j_2^{Li}(x,\theta_2,t) = -\int_0^{Lj} j_1^{Li}(x,\theta_1,t) \quad (11)$$

As will be described hereinafter, the battery model expression expressed by the fundamental equations constituted of the aforementioned expressions (1) to (11) can be simplified. The simplification of the battery model expression makes it possible to reduce the calculation load and shorten the calculation time.

It is assumed that the electrochemical reaction in each of the negative electrode 142 and the positive electrode 141 is uniform. That is, it is assumed that the reaction in an x-direction occurs homogeneously in each of the electrodes 142 and 141. Besides, it is assumed that the reactions in a plurality of the active materials 142b and 141b that are included in the electrodes 142 and 141 respectively are homogeneous. Therefore, the active materials 142b and 141b of the respective electrodes 142 and 141 are handled as a single active material model. Thus, the structure of the secondary battery 1 shown in FIG. 3 can be modeled into a structure shown in FIG. 5.

Figure 5:
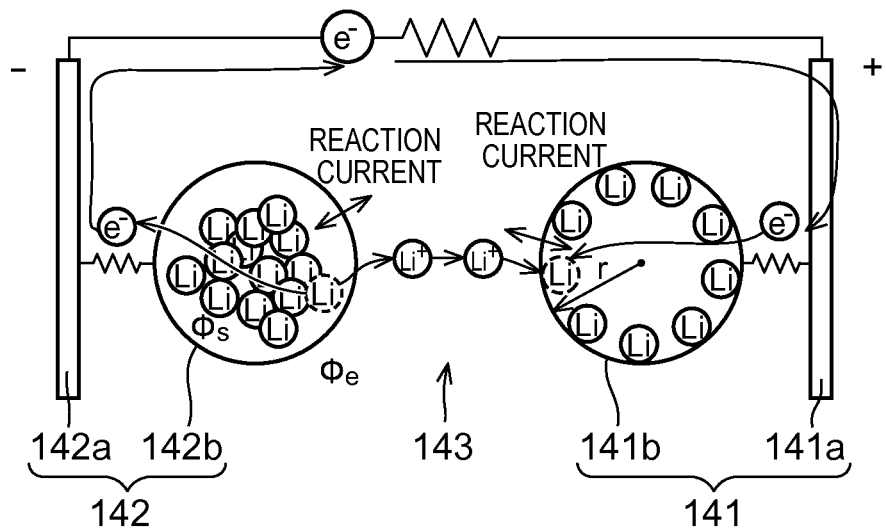
FIG. 5 is a conceptual view illustrating a battery model.

In a battery model shown in FIG. 5, an electrode reaction on the surface of the active material model 141b of the positive electrode 141 can be modeled, and an electrode reaction on the surface of the active material model 142b of the negative electrode 142 can be modeled. Besides, in the battery model shown in FIG. 5, the diffusion of lithium (in a radial direction) inside the active material models 141b and 142b, and the diffusion of lithium ions (concentration distribution) in the electrolytic solution can be modeled. Furthermore, potential distribution and temperature distribution can be modeled in each section of the battery model shown in FIG. 5.

Figure 6:
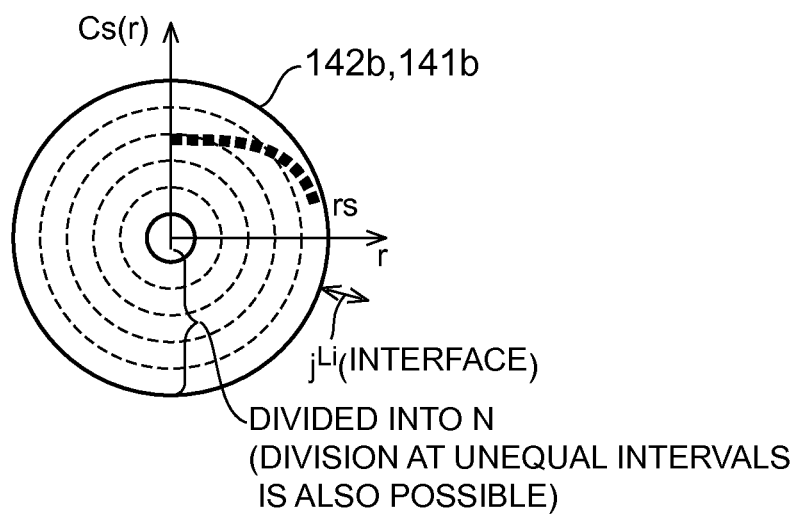
FIG. 6 is a conceptual view showing an active material model that is indicated by polar coordinates.

As shown in FIG. 6, a concentration $c_s$ of lithium inside each of the active material models 141b and 142b can be expressed as a function on a radial coordinate r of each of the active material models 141b and 142b. It should be noted that r denotes a distance from the center of each of the active material models 141b and 142b to each point, and that $r_s$ denotes a radius of each of the active material models 141b and 142b. It is assumed herein that there is no positional dependency in a circumferential direction of each of the active material models 141b and 142b.

Each of the active material models 141b and 142b shown in FIG. 6 is used to estimate a lithium diffusion phenomenon inside the active material, which results from an electrochemical reaction on the interface. A concentration $c_{s,k}(t)$ of lithium is estimated according to diffusion equations that will be described later, as to each of N (N: a natural number equal to or larger than 2) regions (k=1 to N) that are divided from one another in the radial direction of each of the active material models 141b and 142b. It should be noted herein that the distribution of concentration of lithium in the active material is obtained by the concentrations $c_{s,k}(t)$ of lithium in the N regions that are divided from one another.

According to the battery model shown in FIG. 5, the fundamental equations (1) to (6) and (8) can be expressed by expressions (1') to (6') and (8') shown below, respectively.

[Mathematical Expressions 4]

$$j_j^{Li}\#(\theta_j,t)/a_{sj} = i_{0j}\#(\theta_j,T,t) \cdot [\exp(\alpha_{aj}F/RT \cdot \eta_j\#(\theta_j,t)) - \exp(-\alpha_{cj}F/RT \cdot \eta_j\#(\theta_j,t))] \quad (1')$$

$$\eta_j\#(\theta_j,t) = \phi_{sj}\#(t) - \phi_{ej}\#(t) - U_j\#(\theta,t) \quad (2')$$

$$c_{ej}(t) = \text{const.} \quad (3')$$

$$\partial c_{sj}(r_j,t)/\partial t = D_{sj}[\partial^2 c_{sj}/\partial r_j^2 + 2/r_j \cdot \partial c_{sj}/\partial r_j] \quad (4')$$

$$\partial c_{sj}(r_j,t)/\partial r|_{r_j=0} = 0 \quad (5')$$

$$\partial [\varepsilon_{sj} c_{sj}(r_j,t)]/\partial t|_{r_j=s_j} = -j_j^{Li}\#(\theta_j,t)/a_{sj}F \quad (6')$$

$$c_{sej} = c_{sj}(r_{sj},t) \quad (8)$$

In the aforementioned expression (3'), $c_{ej}(t)$ is assumed to be a constant value by assuming that the concentration of the electrolytic solution is invariable with respect to time. Besides, as for the active material models 141b and 142b, the diffusion equations (4) to (6) are transformed into the diffusion equations (4') to (6') in consideration only of the distribution in a polar coordinate direction. In the aforementioned expression (8'), the concentration $c_{sej}$ of lithium on the interface of the active material corresponds to a concentration $c_{sj}(t)$ of lithium in the outermost peripheral region among the N divided regions shown in FIG. 6.

The aforementioned expression (9) regarding the conservation law of electrical charges in the electrolytic solution is simplified into an expression (12) shown below, using the aforementioned expression (3'). That is, a potential $\phi_{ej}$ of the electrolytic solution is approximated as a quadratic function of x. An average potential $\phi_{ej}\#$ in the electrolytic solution, which is used to calculate an overvoltage $\eta_j\#$, is obtained by an expression (13) shown below, which is derived through integration of the following expression (12) by an electrode thickness $L_j$.

As for the negative electrode 142, an expression (14) shown below is established based on the following expression (12). Therefore, a potential difference between an electrolytic solution average potential $\phi_{e2}\#$ and an electrolytic solution potential on the boundary between the negative electrode 142 and the separator 143 is expressed by an expression (15) shown below. As for the positive electrode 141, a potential difference between an electrolytic solution average potential $\phi_{e1}\#$ and an electrolytic solution potential on the boundary between the positive electrode 141 and the separator 143 is expressed by an expression (16) shown below.

[Mathematical Expressions 5]

$$\nabla \cdot [\kappa_j^{e\!f\!f}(t) \nabla \phi_{ej}(x,t)] + j_j^{L1}\#(\theta_j,t) = 0 \Leftrightarrow \phi_{ej}(x,t) = -j_j^{L1}\#(\theta_j,t)/2\kappa_j^{e\!f\!f} \cdot x^2 \quad (12)$$

$$\phi_{ej}\#(t) = -j_j^{Li}\#(\theta_j,t)/2\kappa_j^{e\!f\!f} \cdot 1/L_j \int_0^{Lj} x^2 dx = j_j^{Li}\#(\theta_j,t)/6\kappa_j^{e\!f\!f} \cdot L_j^2 \quad (13)$$

$$\phi_{e2}(L_2,t) = -j_2^{Li}\#(\theta_2,t)/2\kappa_2^{e\!f\!f} \cdot L_2^2 \quad (14)$$

$$\phi_{e2}\#(t) - \phi_{e2}(L_2,t) = -j_2^{Li}\#(\theta_2,t)/6\kappa_2^{e\!f\!f} \cdot L_2^2 - (-j_2^{Li}\#(\theta_2,t)/2\kappa_2^{e\!f\!f} \cdot L_2^2) = j_2^{Li}\#(\theta_2,t)/3\kappa_2^{e\!f\!f} \cdot L_2^2 = L_2/3\kappa_2^{e\!f\!f} \cdot I \quad (15)$$

$$\phi_{e1}\#(t) - \phi_{e1}(L_1,t) = j_1^{Li}\#(\theta_1,t)/3\kappa_1^{e\!f\!f} \cdot L_1^2 = -L_1/3\kappa_1^{e\!f\!f} \cdot I \quad (16)$$

The aforementioned expression (10) regarding the conservation law of electrical charges in the active material can also be simplified into an expression (17) shown below. That is, a potential $\phi_{sj}$ of the active material is also approximated as a quadratic function of x. An average potential $\phi_{sj}\#$ in the active material, which is used to calculate the overvoltage $\eta_j\#$, is obtained by an expression (18) shown below, which is derived through integration of the following expression (17) by the electrode thickness $L_j$. Therefore, as for the positive electrode 141, a potential difference between an active material average potential $\phi_{s1}\#$ and an active material potential on the boundary between the active material model 141b and the current collector 141a is expressed by an expression (19) shown below. By the same token, an expression (20) shown below is established as to the negative electrode 142.

[Mathematical Expressions 6]

$$\nabla \cdot [\sigma_j^{eff} \nabla \phi_{sj}(x,t)] - j_j^{Li}\#(\theta_j,t) = 0 \Leftrightarrow \phi_{sj}(x,t) = j_j^{Li}\#(\theta_j,t)/2\sigma_j^{eff} \cdot x^2 \quad (17)$$

$$\phi_{sj}\#(t) = j_j^{Li}\#(\theta_j,t)/2\sigma_j^{eff} \cdot 1/L_j \int_0^{L_j} x^2 dx \quad (18)$$

$$\phi_{s1}\#(t) - \phi_{s1}(L_1,t) = -j_1^{Li}\#(\theta_1,t)/3\sigma_1^{eff} \cdot L_1^2 = L_1/3\sigma_1^{eff} \cdot I \quad (19)$$

$$\phi_{s2}\#(t) - \phi_{s2}(L_2,t) = -j_2^{Li}\#(\theta_2,t)/3\sigma_2^{eff} \cdot L_2^2 = -L_2/3\sigma_2^{eff} \cdot I \quad (20)$$

Figure 7:
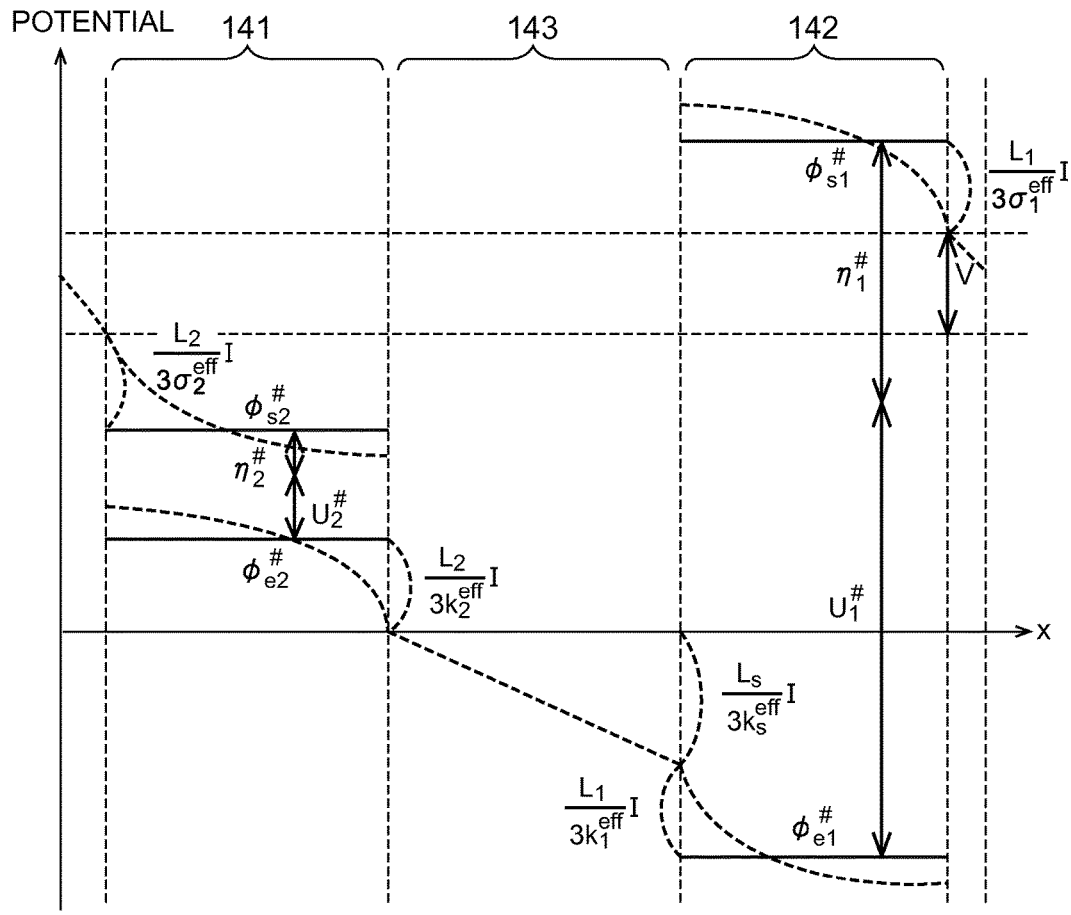
FIG. 7 is a view showing a relationship between a voltage value of the secondary battery and various average potentials.

FIG. 7 shows a relationship between a terminal voltage V(t) of the secondary battery 1 and the respective average potentials obtained as described above. Referring to FIG. 7, in the separator 143, the reaction current density $j_j^{Li}$ is 0, so the fall in voltage in the separator 143 is proportional to a current density I(t), and is equal to $L_s/\kappa_s^{eff} \cdot I(t)$.

Besides, since it is assumed that the electrochemical reactions in the respective electrodes are uniform, an expression (21) shown below is established between the current density I(t) and the reaction current density (the generation amount of lithium) $j_j^{Li}$ per unit area of a pole plate.

[Mathematical Expression 7]

$$I(t) = -j_1^{Li}(\theta_1,t)L_1 = j_2^{Li}(\theta_2,t)L_2 \quad (21)$$

Based on the relationship in potential shown in FIG. 7 and the aforementioned expression (21), an expression (22) shown below is established as to the battery voltage V(t). The following expression (22) is premised on a potential relational expression as an expression (23) shown in FIG. 7.

Subsequently, an average overvoltage $\eta\#(t)$ is calculated. Given that $j_j^{Li}$ is constant, the charge/discharge efficiency is the same in the Butler-Volmer relational expressions, and that $\alpha_{aj}$ and $\alpha_{cj}$ are 0.5, an expression (24) shown below is established. By inversely transforming the following expression (24), the average overvoltage $\eta\#(t)$ is obtained by an expression (25) shown below.

[Mathematical Expressions 8]

$$V(t) = \phi_{s1}\#(t) - L_1/3\sigma_1^{eff} \cdot I(t) - (\phi_{s2}\#(t) + L_2/3\sigma_2^{eff} \cdot I(t)) \quad (22)$$

$$\phi_{sj}\#(t) = U_j\#(t) + \phi_{ej}\#(t) + \eta_j\#(t) \quad (23)$$

$$j_j^{Li}\# = a_{sj}i_{0j}(\theta_j,t) \cdot [\exp(\alpha_{aj}F/RT \cdot \eta_j\#(t)) - \exp(\alpha_{cj}F/RT \cdot \eta_j\#(t))] = 2a_{sj}i_{0j}(\theta_j,t)\sin h(\alpha_{aj}F/RT \cdot \eta_j\#(t)) \quad (24)$$

$$\eta_j\#(t) = RT/\alpha_{aj}F \cdot \arcsin h(j_j^{Li}\#(\theta_j,t)/2a_{sj}i_{0j}(\theta_j,t)) \quad (25)$$

The average potentials $\phi_{s1}$ and $\phi_{s2}$ are obtained using FIG. 7, and the obtained values are substituted for the corresponding variables in the aforementioned expression (22). Besides, average overvoltages $\eta_1\#(t)$ and $\eta_2\#(t)$ obtained from the aforementioned expression (25) are substituted for the corresponding variables in the aforementioned expression (23). As a result, a voltage-current relational model expression (M1a) according to an electrochemical reaction model expression is derived based on the aforementioned expressions (1') and (21) and the aforementioned expression (2').

By the aforementioned expression (4') as the conservation law of the concentration of lithium (the diffusion equation) and the boundary condition expressions (5') and (6'), active material diffusion model expressions (M2a) are obtained as to the active material models 141b and 142b.

[Mathematical Expressions 9]

$$V(t) = \{U_1\#(\theta_1,t) - U_2\#(\theta_2,t)\} + RT/\alpha_{a1}F\{\arcsin h(-I(t)/2L_1a_{s1}i_{01}(\theta_1,T,t)) - \arcsin h(I(t)/2L_2a_{s2}i_{02}(\theta_2,T,t))\} - I(t)(L_1/3\kappa_1^{eff} + L_s/3\kappa_s^{eff} + L_2/3\kappa_2^{eff} + L_1/3\sigma_1^{eff} + L_2/3\sigma_2^{eff}) \quad (M1a)$$

$$Rd(T) = (L_1/3\kappa_1^{eff} + L_s/3\kappa_s^{eff} + L_2/3\kappa_2^{eff} + L_1/3\sigma_1^{eff} + L_2/3\sigma_2^{eff}),$$

$$\partial c_{s1}(r_1,t)/\partial t = D_{s1}(T)[\partial^2 c_{s1}/\partial r_1^2 + 2/r_1 \cdot \partial c_{s1}/\partial r_1],$$

$$\partial c_{s2}(r_2,t)/\partial t = D_{s2}(T)[\partial^2 c_{s2}/\partial r_2^2 + 2/r_2 \cdot \partial c_{s2}/\partial r_2] \quad (M2a)$$

The first term of the right side of the model expression (M1a) indicates an open-circuit voltage (OCV) that is determined by the concentration of a reactant (lithium) on the surface of the active material, the second term of the right side indicates an overvoltage ($\eta_1\# - \eta_2\#$), and the third term of the right side indicates a fall in voltage resulting from the flow of a current through the secondary battery. That is, the direct-current resistance of the secondary battery 10 is denoted by Rd(T) in the expressions (M2a).

An open-circuit potential $U_1$ included in the expression (M1a) depends on a local SOC $\theta_1$ of the positive electrode active material model 141b. Therefore, if a corresponding relationship between the open-circuit potential $U_1$ and the local SOC $\theta_1$ is obtained in advance through an experiment or the like, the open-circuit potential $U_1$ can be calculated by specifying the local SOC $\theta_1$. The corresponding relationship between the open-circuit potential $U_1$ and the local SOC $\theta_1$ can be expressed as a map or a function. Information on this corresponding relationship can be stored into the memory 300a.

Figure 8:
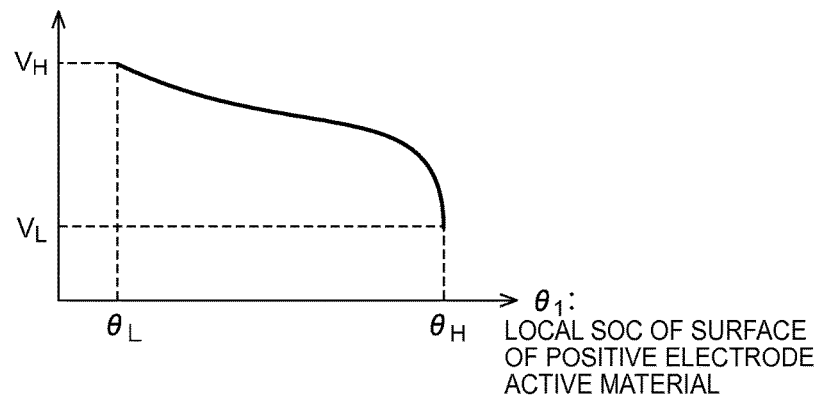
FIG. 8 is a view showing a relationship between an open-circuit potential and a local SOC as to a positive electrode.

FIG. 8 shows the corresponding relationship between the open-circuit potential $U_1$ and the local SOC $\theta_1$ in the form of a map. According to the map shown in FIG. 8, the open-circuit potential $U_1$ falls as the local SOC $\theta_1$ rises. In FIG. 8, a local SOC $\theta_H$ is higher than a local SOC $\theta_L$, and an open-circuit potential $V_H$ is higher than an open-circuit potential $V_L$.

Figure 9:
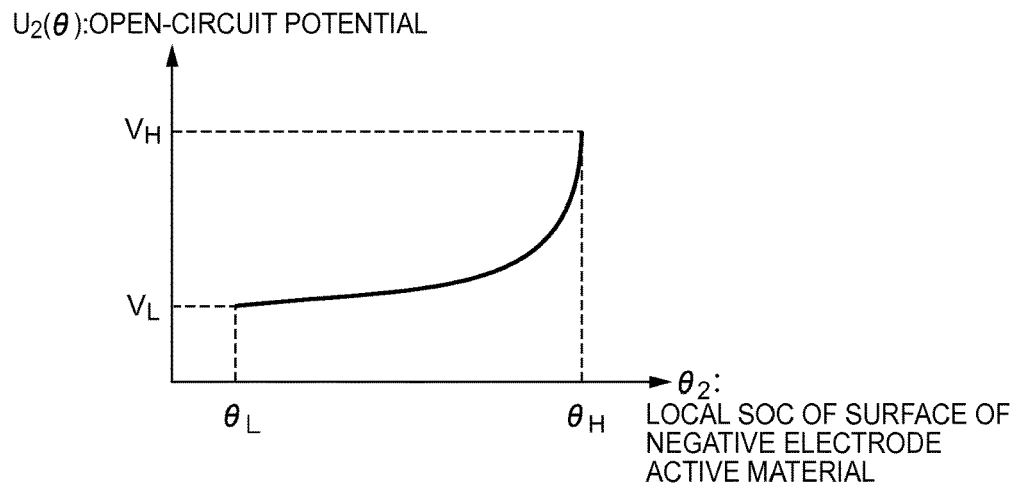
FIG. 9 is a view showing a relationship between the open-circuit potential and the local SOC as to a negative electrode.

Besides, an open-circuit potential $U_2$ depends on a local SOC $\theta_2$ of the negative electrode active material model 142b. Therefore, if a corresponding relationship between the open-circuit potential $U_2$ and the local SOC $\theta_2$ is obtained in advance through an experiment or the like, the open-circuit potential $U_2$ can be calculated by specifying the local SOC $\theta_2$. The corresponding relationship between the open-circuit potential $U_2$ and the local SOC $\theta_2$ can be expressed in the form of a map or a function. Information on this corresponding relationship can be stored into the memory 300a. FIG. 9 shows the corresponding relationship between the open-circuit potential $U_2$ and the local SOC $\theta_2$ in the form of a map. According to the map shown in FIG. 9, the open-circuit potential $U_2$ rises as the local SOC $\theta_2$ rises.

Exchange current densities $i_{01}$ and $i_{02}$ included in the expression (M1a) depend on the local SOC's $\theta_1$ and $\theta_2$ and the battery temperature Tb. Accordingly, if a corresponding relationship (a map or a function) among the exchange current densities $i_{01}$ and $i_{02}$, the local SOC's $\theta_1$ and $\theta_2$, and the battery temperature Tb is prepared in advance, the exchange current densities $i_{01}$ and $i_{02}$ can be specified from the local SOC's $\theta_1$ and $\theta_2$ and the battery temperature Tb.

The direct-current resistance Rd depends on the battery temperature Tb. Accordingly, if a corresponding relationship (a map or a function) between the direct-current resistance Rd and the battery temperature Tb is prepared in advance, the direct-current resistance Rd can be specified from the battery temperature Tb. Incidentally, the corresponding relationship between the direct-current resistance Rd and the battery temperature Tb can be created based on a result of an experiment such as the well-known measurement of an alternating-current impedance of the secondary battery 1 or the like.

The battery model shown in FIG. 5 can be further simplified. Concretely, a common active material model can be employed as the active materials of the electrodes 142 and 141. The expressions can be replaced as indicated by expressions (26) shown below, by handling the active material models 141b and 142b shown in FIG. 5 as a single active material model. In the following expressions (26), the subscript j that distinguishes between the positive electrode 141 and the negative electrode 142 is omitted.

[Mathematical Expressions 10]

$$U(\theta,t) = U_1 \#(\theta_1,t) - U_2 \#(\theta_2,t),$$

$$i_{0j}(\theta_j,T,t) = i_0(\theta,T,t),$$

$$c_{sj}(r_j,t) = c_s(r,t),$$

$$D_{sj} = D_s,$$

$$a_{sj} = a_s,$$

$$L_j = L,$$

$$\alpha_{sj} = \alpha_s,$$

$$\theta_j = \theta_1 \qquad (26)$$

The model expressions (M1a) and (M2a) can be expressed by expressions (M1b) and (M2b) shown below respectively. Besides, in a battery model using a single active material model, an expression (21') shown below is applied instead of the aforementioned expression (21), as a relational expression of the current density I(t) and the reaction current density $j_j^{Li}$.

[Mathematical Expressions 11]

$$V(t) = U(\theta,t) + RT/\alpha_a F \cdot \operatorname{arcsin} h(-I(t)/2La_s i_0(\theta,T,t)) - I(t)(L_1/3\kappa_1^{eff} + L_s/3\kappa_s^{eff} + L_2/3\kappa_2^{eff} + L_1/3\sigma_1^{eff} + L_2/3\sigma_2^{eff}) \qquad \text{(M1b)}$$

$$Rd(T) = (L_1/3\kappa_1^{eff} + L_s/3\kappa_s^{eff} + L_2/3\kappa_2^{eff} + L_1/3\sigma_1^{eff} + L_2/3\sigma_2^{eff}),$$

$$\partial c_s(r,t)/\partial t = D_s(T)[\partial^2 c_s/\partial r^2 + 2/r \cdot \partial c_s/\partial r] \qquad \text{(M2b)}$$

$$I(t) = -L j^{Li} \#(\theta,t) \qquad (21')$$

An expression (M1c) shown below is obtained by subjecting an arcsin h term in the aforementioned expression (M1a) to first-order approximation (linear approximation). This linear approximation makes it possible to reduce the calculation load and shorten the calculation time.

[Mathematical Expressions 12]

$$V(t) = \{U_1 \#(\theta,t) - U_2 \#(\theta_2,t)\} + RT/\alpha_{a1} F \cdot -I(t)/2L_1 a_{s1} i_{01}(\theta_1,T,t)) - RT/\alpha_{a1} F \cdot I(t)/2L_2 a_{s2} i_{02}(\theta_2,T,t) - I(t)(L_1/3\kappa_1^{eff} + L_s/3\kappa_s^{eff} + L_2/3\kappa_2^{eff} + L_1/3\sigma_1^{eff} + L_2/3\sigma_2^{eff}) \qquad \text{(M1c)}$$

$$Rd(T) = (L_1/3\kappa_1^{eff} + L_s/3\kappa_s^{eff} + L_2/3\kappa_2^{eff} + L_1/3\sigma_1^{eff} + L_2/3\sigma_2^{eff}),$$

$$Rr(\theta_1,\theta_2,T) = RT/2\alpha_{a1} F\{1/L_1 \alpha_{s1} i_{01}(\theta_1,T) + 1/L_2 \alpha_{s2} i_{02}(\theta_2,T)\} \qquad (27)$$

$$V(t) = \{U_1 \#(\theta_1,t) - U_2 \#(\theta_2,t)\} - Rr(\theta_1,\theta_2,T)I(t) - Rd(T) \cdot I(t) \qquad (28)$$

In the aforementioned expression (M1c), the second term of the right side is also expressed by the product of the current density I(t) and a reaction resistance Rr as a result of linear approximation. As indicated by the aforementioned expression (27), the reaction resistance Rr is calculated from the exchange current densities $i_{01}$ and $i_{02}$ that depend on the local SOC's $\theta_1$ and $\theta_2$ and the battery temperature Tb. Accordingly, when the aforementioned expression (M1c) is used, it is appropriate to prepare a corresponding relationship (a map or a function) among the local SOC's $\theta_1$ and $\theta_2$, the battery temperature Tb, and the exchange current densities $i_{01}$ and $i_{02}$ in advance. The aforementioned expression (28) is obtained according to the aforementioned expression (M1c) and the aforementioned expression (27).

When the arcsin h term as the second term of the right side of the aforementioned expression (M1b) is subjected to linear approximation, expressions (M1d) shown below are obtained.

[Mathematical Expressions 13]

$$V(t) = U(\theta,t) + RT/\alpha_a F \cdot -I(t)/2L_1 a_s i_0(\theta,t) - I(t)(L_1/3\kappa_1^{eff} + L_s/3\kappa_s^{eff} + L_2/3\kappa_2^{eff} + L_1/3\sigma_1^{eff} + L_2/3\sigma_2^{eff}),$$

$$-Rr(\theta,t) \cdot I(t) = RT/\alpha_a F \cdot -I(t)/2L_1 a_s i_0(\theta,t),$$

$$Rd(T) = (L_1/3\kappa_1^{eff} + L_s/3\kappa_s^{eff} + L_2/3\kappa_2^{eff} + L_1/3\sigma_1^{eff} + L_2/3\sigma_2^{eff}) \qquad \text{(M1d)}$$

The aforementioned expression (M1b) can be expressed as an expression (M1e) shown below.

[Mathematical Expression 14]

$$V(t) = U(\theta,t) - I(t)Rd(T) + RT/\alpha_a F \cdot \operatorname{arcsin} h(-I(t)/2La_s i_0(\theta,T,t)) \qquad \text{(M1e)}$$

By being subjected to first-order approximation (linear approximation), the aforementioned expression (M1e) is expressed by an expression (M1f) shown below.

[Mathematical Expression 15]

$$V(t) = U(\theta,t) - I(t)Rd(T) + RT/\alpha_a F \cdot -I(t)/2La_s i_0(\theta,T,t) \qquad \text{(M1f)}$$

Figure 10:
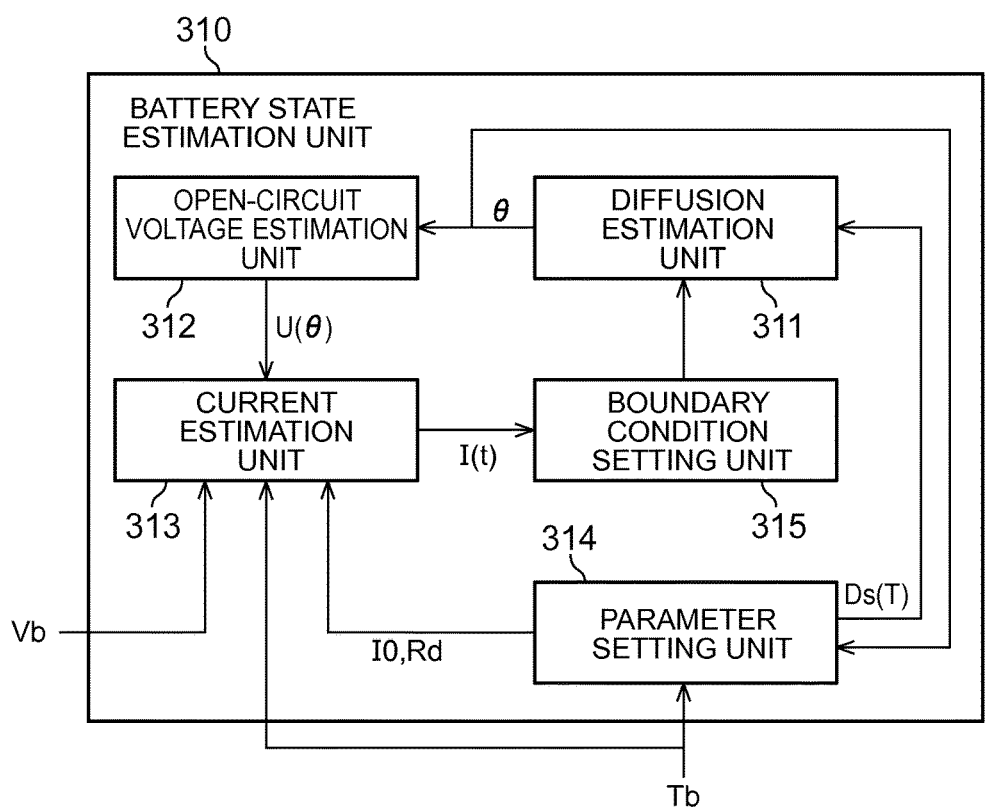
FIG. 10 is a schematic view showing the configuration of a battery state estimation unit that is provided inside a controller.

Next, a configuration of estimating the internal state of the secondary battery 1 through the use of the aforementioned battery model expressions will be described. FIG. 10 is a schematic view showing the internal configuration of the controller 300. A battery state estimation unit 310 that is included in the controller 300 has a diffusion estimation unit 311, an open-circuit voltage estimation unit 312, a current estimation unit 313, a parameter setting unit 314, and a boundary condition setting unit 315. In the configuration shown in FIG. 10, the battery state estimation unit 310 calculates the current density I(t) by using the aforementioned expression (M1f) and the aforementioned expression (M2b).

In the present embodiment of the invention, the current density I(t) is calculated through the use of the aforementioned expressions (M1f) and (M2b), but the invention should not be limited thereto. Concretely, the current density I(t) can be calculated based on an arbitrary combination of any one of the aforementioned expressions (M1a) to (M1e) and the aforementioned expressions (M2a) or the aforementioned expression (M2b).

The diffusion estimation unit 311 calculates a distribution of concentration of lithium inside the active material, based on a boundary condition set by the boundary condition setting unit 315, through the use of the aforementioned expression (M2b). The boundary condition is set based on the aforementioned expression (5') or the aforementioned expression (6'). The diffusion estimation unit 311 calculates the local SOC θ based on the calculated distribution of concentration of lithium, through the use of the aforementioned expression (7). The diffusion estimation unit 311 outputs information on the local SOC θ to the open-circuit voltage estimation unit 312. It should be noted herein that $θ_1$ and $θ_2$ are calculated as the local SOC's θ in the two active material models 141b and 142b shown in FIG. 5, respectively. Besides, in the case where the active material models 141b and 142b are standardized, the local SOC θ in a single active material model is calculated.

The open-circuit voltage estimation unit 312 specifies the open-circuit potentials $U_1$ and $U_2$ of the electrodes 141 and 142, based on the local SOC's θ ($θ_1$ and $θ_2$) calculated by the diffusion estimation unit 311, respectively. Concretely, the open-circuit voltage estimation unit 312 can specify the open-circuit potentials $U_1$ and $U_2$ by using, for example, maps shown in FIGS. 8 and 9. The open-circuit voltage estimation unit 312 can calculate the open-circuit voltage of the secondary battery 1 based on the open-circuit potentials $U_1$ and $U_2$. The open-circuit voltage of the secondary battery 1 is obtained by subtracting the open-circuit potential $U_2$ from the open-circuit potential $U_1$.

The parameter setting unit 314 sets the parameters that are used in the battery model expression, in accordance with the battery temperature Tb and the local SOC's θ. The temperature Tb detected by the temperature sensor 203 is used as the battery temperature Tb. The local SOC's θ are acquired from the diffusion estimation unit 311. The parameters that are set by the parameter setting unit 314 include a diffusion constant $D_s$ in the aforementioned expression (M2b), and the current density $i_0$ and the direct-current resistance Rd in the aforementioned expression (M1f).

The current estimation unit 313 calculates (estimates) the current density I(t) through the use of an expression (M3a) shown below. The following expression (M3a) is an expression that is obtained by transforming the aforementioned expression (M1f). In the following expression (M3a), an open-circuit voltage U(θ, t) is an open-circuit voltage U(θ) that is estimated by the open-circuit voltage estimation unit 312. The voltage V(t) is the battery voltage Vb that is acquired by employing the monitoring unit 201. Rd(t) and $i_0(θ,T,t)$ are the values set by the parameter setting unit 314.

[Mathematical Expression 16]

$$I(t)=U(θ,t)-V(t)/Rd(T)+RT/α_aF2La_si_0(θ,T,t) \quad (M3a)$$

Incidentally, even in the case where any one of the aforementioned expressions (M1a) to (M1e) is used, the current density I(t) can be calculated according to a method similar to that of the aforementioned expression (M3a).

The boundary condition setting unit 315 calculates the reaction current density (the generation amount of lithium) $j_j^{Li}$ from the current density I(t) that is calculated by the current estimation unit 313, through the use of the aforementioned expression (21) or the aforementioned expression (21'). Then, the boundary condition setting unit 315 updates the boundary condition in the aforementioned expression (M2b) through the use of the aforementioned expression (6').

Figure 11:
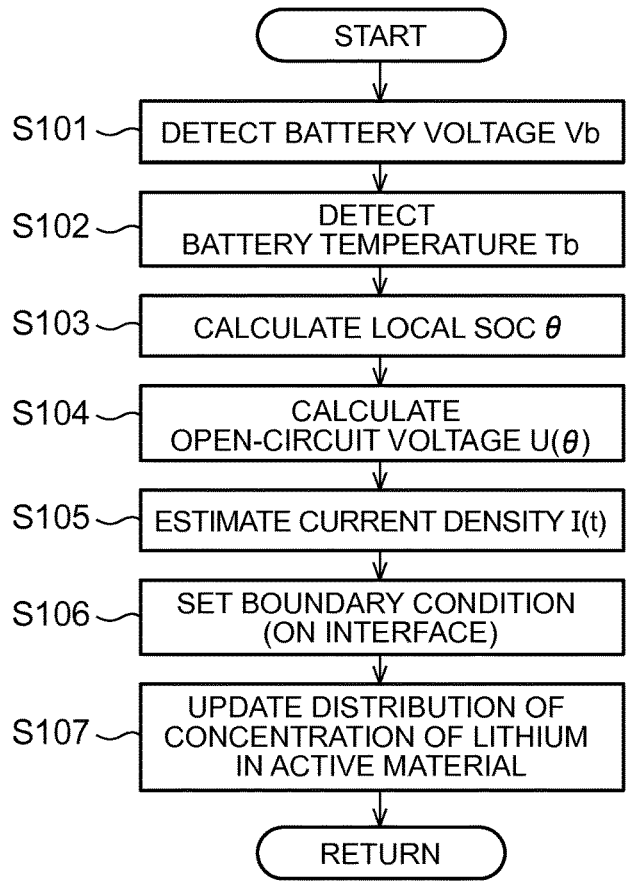
FIG. 11 is a flowchart showing a processing of the battery state estimation unit.

Next, the processing of the battery state estimation unit 310 will be described through the use of a flowchart shown in FIG. 11. The processing shown in FIG. 11 is executed on a predetermined cycle.

In step S101, the battery state estimation unit 310 detects the voltage value (the battery voltage) Vb of the secondary battery 1 based on an output of the monitoring unit 201. Besides, in step S102, the battery state estimation unit 310 detects the temperature (the battery temperature) Tb of the secondary battery 1 based on an output of the temperature sensor 203.

In step S103, the battery state estimation unit 310 (the diffusion estimation unit 311) calculates the local SOC's θ based on a distribution of concentration of lithium at the time of last calculation in which the aforementioned expression (M2b) is used. In step S104, the battery state estimation unit 310 (the open-circuit voltage estimation unit 312) calculates the open-circuit voltage U(θ) from the local SOC's θ obtained in step S103.

In step S105, the battery state estimation unit 310 (the current estimation unit 313) calculates (estimates) the current density I(t) through the use of the aforementioned expression (M3a). The estimated current density I(t) is obtained by substituting the battery voltage Vb, the battery temperature Tb, the open-circuit voltage U(θ) obtained in step S103, and the parameter values set by the parameter setting unit 314 for the corresponding variables in the aforementioned expression (M3a).

In step S106, the battery state estimation unit 310 (the boundary condition setting unit 315) calculates the reaction current density (the generation amount of lithium) $j_j^{Li}$ from the estimated current density I(t) obtained in step S105. Besides, the battery state estimation unit 310 (the boundary condition setting unit 315) sets the boundary condition on the interface of the active material in the aforementioned expression (M2b), through the use of the calculated reaction current density.

In step S107, the battery state estimation unit 310 (the diffusion estimation unit 311) calculates the distribution of concentration of lithium inside the active material model, through the use of the aforementioned expression (M2b), and updates the estimated value of the concentration of lithium in each of the regions. It should be noted herein that the concentration of lithium (the updated value) in the outermost peripheral one of the divided regions is used to execute the process of step S103 (to calculate the local SOC's θ) when the processing shown in FIG. 11 is executed next time.

According to the processing shown in FIG. 11, the current of the battery (the current density I(t) of the battery) is estimated using the battery voltage Vb as an input. The internal state of the secondary battery 1 (the distribution of concentration of lithium in the active material) can be estimated based on this estimated value. For example, the SOC of the secondary battery 1 can be estimated by estimating the internal state of the secondary battery 1. A processing of estimating the SOC of the secondary battery 1 will be described hereinafter. The processing of estimating the SOC is executed by the controller 300.

First of all, the controller 300 calculates an average concentration $c_{save}$ of lithium based on the distribution of concentration of lithium, by using an expression (29) shown below.

[Mathematical Expression 17]

$$c_{save}(t) = {}^N\Sigma_{k=1} c_{s1,k}(t) \cdot \Delta V_k / V \quad (29)$$

A concentration $c_{s1,k}(t)$ (k=1 to N) of lithium shown in the aforementioned expression (29) is a concentration of lithium in each of the N regions that are obtained by dividing each of the active material models 141b and 142b, as shown in FIG. 6, and is estimated by the diffusion model expressions (M2a) and (M2b). Besides, $\Delta Vk$ indicates the volume of each of the divided regions, and V indicates the volume of the entire active material. Besides, in the case where the active material models in the positive electrode and the negative electrode are standardized, the average concentration $c_{save}(t)$ of lithium can be obtained by obtaining an average of the concentrations $c_{s,k}(t)$ (k=1 to N) of lithium in the respective regions in the standardized active material model, in the same manner as the aforementioned expression (29).

Subsequently, the controller 300 estimates the SOC of the secondary battery 1 based on an expression (30) shown below.

[Mathematical Expression 18]

$$SOC = CO - c_{save}(t)/CO - Cf \times 100 \quad (30)$$

Figure 12:
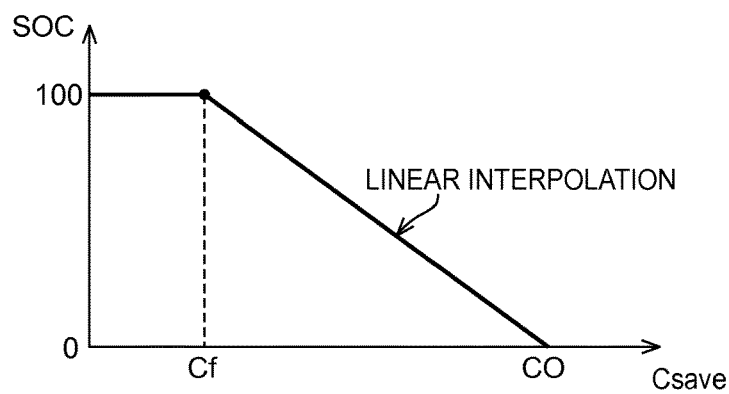
FIG. 12 is a view showing a corresponding relationship between an average concentration of lithium and an SOC.

The contents of the aforementioned expression (30) will be described using FIG. 12. FIG. 12 shows a relationship between the average concentration $c_{save}$ of lithium and the SOC (the estimated value) in the positive electrode active material model 141b. FIG. 12 shows a relationship between the average concentration $c_{save}$ of lithium and the SOC in the positive electrode active material 141b, but the invention should not be limited thereto. That is, the average concentration $c_{save}$ of lithium in the negative electrode active material model 142b can also be used instead of the average concentration $c_{save}$ of lithium in the positive electrode active material model 141b.

In an example shown in FIG. 12, the SOC (the estimated value) falls as the average concentration $c_{save}$ of lithium rises. It should be noted herein that if an average concentration Cf of lithium at the time when the SOC of the secondary battery 1 is 100(%) and an average concentration CO of lithium at the time when the SOC of the secondary battery 1 is 0(%) are calculated, linear interpolation can be carried out as shown in FIG. 12. Thus, the use of the aforementioned expression (30) makes it possible to calculate the SOC of the secondary battery 1 from the average concentration $c_{save}$ of lithium.

In the present embodiment of the invention, as described above, the diffusion coefficient $D_s$ that is used in the diffusion equations shown in the aforementioned expressions (M2a) or the diffusion equation shown in the aforementioned expression (M2b) is corrected. Concretely, the diffusion coefficient $D_s$ is corrected based on an expression (31) shown below. It should be noted herein that when the internal state of the secondary battery 1 is estimated through the use of the diffusion equations shown in the aforementioned equations (M2a) or the diffusion equation shown in the aforementioned expression (M2b), the diffusion coefficient $D_s$ corrected based on the following expression (31) is used.

[Mathematical Expression 19]

$$D_s(t) = D_{s\_ini} \times k(t) \quad (31)$$

In the aforementioned expression (31), $D_{s\_ini}$ is a reference value of the diffusion coefficient, and is a value that is specified in advance through an experiment or the like in a state where the influence of the charge/discharge history is negligible. The diffusion coefficient $D_{s\_ini}$ depends on the battery temperature Tb. Therefore, if a corresponding relationship (a map or a function) between the diffusion coefficient $D_{s\_ini}$ and the battery temperature Tb is obtained in advance, the diffusion coefficient $D_{s\_ini}$ can be calculated by detecting the battery temperature Tb. It should be noted herein that information on the corresponding relationship between the diffusion coefficient $D_{s\_ini}$ and the battery temperature Tb can be stored into the memory 300a.

Figure 13:
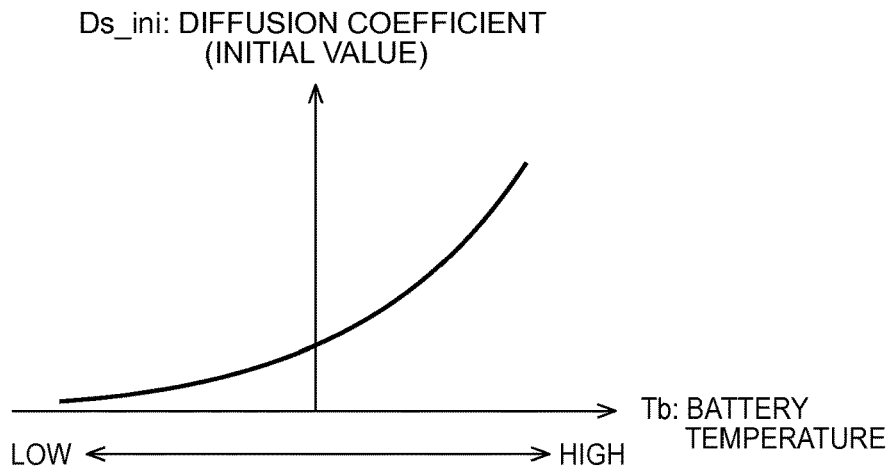
FIG. 13 is a view showing a corresponding relationship between a diffusion coefficient (a reference value) and a battery temperature.

It should be noted herein that FIG. 13 shows a corresponding relationship between the diffusion coefficient $D_{s\_ini}$ and the battery temperature Tb. As shown in FIG. 13, in general, the diffusion coefficient $D_{s\_ini}$ rises as the battery temperature Tb rises. In other words, the diffusion coefficient $D_{s\_ini}$ falls as the battery temperature Tb falls.

As for the diffusion coefficient $D_{s\_ini}$, the dependency on the local SOC θ as well as the dependency on the battery temperature Tb can be taken into account. In this case, if a corresponding relationship (a map or a function) among the diffusion coefficient $D_{s\_ini}$, the battery temperature Tb, and the local SOC θ is obtained in advance, the diffusion coefficient $D_{s\_ini}$ can be calculated by specifying the battery temperature Tb and the local SOC θ. It should be noted herein that information on the corresponding relationship among the diffusion coefficient $D_{s\_ini}$ the battery temperature Tb, and the local SOC θ can be stored into the memory 300a.

As indicated by the aforementioned expressions (M2a), when a diffusion equation is provided for as to each of the active material models 141b and 142b, it is appropriate to calculate the diffusion coefficient $D_{s\_ini}$ corresponding to each of diffusion coefficients $D_{s1}$ and $D_{s2}$. It should be noted herein that the diffusion coefficient $D_{s\_ini}$ is calculated according to the method described above.

In the aforementioned expression (31), k is a correction coefficient. The correction coefficient k is used to correct the diffusion coefficient $D_{s\_ini}$ in consideration of the influence of the charge/discharge history of the secondary battery 1. The parameters specifying the charge/discharge history include, for example, a variation $\Delta SOC$ and an average current value I_ave.

The variation $\Delta SOC$ is an amount (a maximum value) of change in the SOC of the secondary battery 1 during a predetermined period $\Delta t$. Concretely, if a maximum value of the SOC and a minimum value of the SOC are specified from the history of fluctuations in the SOC during the predetermined period $\Delta t$, the variation $\Delta SOC$ is a difference between the SOC (the maximum value) and the SOC (the minimum value). When the secondary battery 1 is charged or discharged, the SOC of the secondary battery 1 changes, so the variation $\Delta SOC$ can be used as the charge/discharge history. It should be noted herein that the likelihood of change in the distribution of concentration of lithium inside the active material increases as the variation $\Delta SOC$ increases.

The average current value I_ave is an average of the current value Ib at the time when the secondary battery 1 is charged/discharged during the predetermined period $\Delta t$. If the current value Ib is detected by the current sensor 202 during the predetermined period $\Delta t$, the average current value I_ave can be calculated. When the secondary battery 1 is charged or discharged, the current value Ib changes between positive values and negative values. Therefore, the current value Ib of the secondary battery 1 can be used as the charge/discharge history.

It should be noted herein that when the second battery 1 is charged/discharged, the current value Ib is likely to change, so the average current value I_ave is preferably used as the charge/discharge history during the predetermined period Δt. If the integrated value of discharge current is larger than the integrated value of charge current during the predetermined period Δt, the average current value I_ave assumes a positive value. On the other hand, if the integrated value of charge current is larger than the integrated value of discharge current, the average current value I_ave assumes a negative value.

The correction coefficient k is changed in accordance with the parameters specifying the charge/discharge history. Concretely, if a corresponding relationship (a map or a function) between at least one of the variation ΔSOC and the average current value I_ave and the correction coefficient k is obtained in advance through an experiment or the like, the correction coefficient k can be calculated by specifying the variation ΔSOC and the average current value I_ave. It should be noted herein that information on the corresponding relationship between the variation ΔSOC (or/and the average current value I_ave) and the correction coefficient k can be stored into the memory 300a.

The corresponding relationship between the variation ΔSOC (or/and the average current value I_ave) and the correction coefficient k may differ depending on the material constituting the secondary battery 1 (the material of the active material in particular) or the like. Therefore, the aforementioned corresponding relationship needs to be obtained through an experiment or the like in which the actually employed secondary battery 1 is used. For example, when a certain material constitutes the secondary battery 1, it is possible to increase the correction coefficient k as the variation ΔSOC increases, or to increase the correction coefficient k as the average current value I_ave increases.

In calculating the correction coefficient k based on the variation ΔSOC and the average current value I_ave, the influence of the variation ΔSOC on the correction coefficient k and the influence of the average current value I_ave on the correction coefficient k may be different from each other. In this case, the correction coefficient k can be calculated in consideration of the respective influences.

Concretely, first of all, the correction coefficient k1 is calculated from only the variation ΔSOC, and the correction coefficient k2 is calculated from only the average current value I_ave. Then, the correction coefficient k can be calculated by weighting and summating the correction coefficients k1 and k2. If the influence of the variation ΔSOC on the correction coefficient k and the influence of the average current value I_ave on the correction coefficient k are confirmed through an experiment or the like, weighting coefficients by which the correction coefficients k1 and k2 are multiplied respectively can be set.

In the present embodiment of the invention, the diffusion coefficient $D_s$ is calculated by multiplying the diffusion coefficient $D_{s\_ini}$ by the correction coefficient k, but the invention should not be limited thereto. For example, the diffusion coefficient $D_s$ can also be calculated by adding a correction value to the diffusion coefficient $D_{s\_ini}$ or subtracting the correction value from the diffusion coefficient $D_{s\_ini}$. In this case, the correction value may be changed in accordance with the variation ΔSOC and the average current value I_ave. The method of correcting the diffusion coefficient $D_{s\_ini}$ can be appropriately selected.

The aforementioned predetermined period Δt is a period to the present time, and is a period of the charge/discharge history that influences the present performance of the secondary battery 1. The predetermined period Δt can be set through an experiment or the like while considering whether or not the present performance of the secondary battery 1 is influenced. The predetermined period Δt may differ depending on the material constituting the secondary battery 1.

In order to calculate the variation ΔSOC and the average current value I_ave, the SOC of the secondary battery 1 and the current value Ib during the predetermined period Δt need to be stored into the memory 300a. It should be noted herein that the amount of data stored in the memory 300a increases as the predetermined period Δt lengthens. Therefore, the predetermined period Δt is preferably set in consideration of the storage capacity of the memory 300a as well.

Considering the storage capacity of the memory 300a, it is preferable to set a minimum required period of the charge/discharge history as the predetermined period Δt. The predetermined period Δt is a period to the present time, so the data (the SOC and the current value Ib) tracing back to the past preceding the present time by the predetermined period Δt or more may be erased from the memory 300a. That is, every time the SOC and the current value Ib are newly acquired, the oldest data (the SOC and the current value Ib) stored in the memory 300a may be erased. Thus, the past data during the predetermined period Δt with respect to the present time can be continuously saved in the memory 300a.

As in the case of the present embodiment of the invention, the secondary batteries 1 that are mounted in the vehicle are charged/discharged in various patterns. For example, when the vehicle is caused to run through the use of only the outputs of the secondary batteries 1, the secondary batteries 1 are continuously discharged. Besides, when external charge is carried out, the secondary batteries 1 are continuously charged.

On the other hand, the vehicle that is equipped with the secondary batteries 1 and the engine can be caused to run while employing the secondary batteries 1 and the engine in combination. In this case, the charge/discharge of the secondary batteries 1 is controlled such that the SOC of each of the secondary batteries 1 changes along the reference SOC. It should be noted herein that the reference SOC can be set in advance.

When the SOC of the secondary battery 1 becomes higher than the reference SOC, the secondary battery 1 is positively discharged, so the SOC of the secondary battery 1 approaches the reference SOC. Besides, when the SOC of the secondary battery 1 becomes lower than the reference SOC, the secondary battery 1 is positively charged, so the SOC of the secondary battery 1 approaches the reference SOC. It should be noted herein that the secondary battery 1 can be charged through the use of regenerative electric power in charging the secondary battery 1. Besides, when the generator converts the kinetic energy from the engine into electric energy, the secondary battery 1 can be charged through the use of the electric power generated by the generator.

By executing charge/discharge control as described above, the SOC of the secondary battery 1 can be changed along the reference SOC. In this charge/discharge control, the charge of the secondary battery 1 and the discharge of the secondary battery 1 are usually repeated in an alternating manner.

If the pattern of charging/discharging the secondary battery 1 is determined in advance, the diffusion coefficient $D_s$ can be set in advance in consideration of this charge/discharge pattern. However, when the secondary battery 1 is charged/discharged according to various patterns, it is not preferable to set the diffusion coefficient $D_s$ in advance. The charge/discharge pattern in the future cannot be predicted. Therefore, when the diffusion coefficient $D_s$ is set in advance, the set diffusion coefficient $D_s$ is likely to deviate from the diffusion coefficient $D_s$ corresponding to the actual internal state of the secondary battery 1. As a result, the accuracy of estimation deteriorates in estimating the internal state of the secondary battery 1.

If the diffusion coefficient $D_s$ is corrected in consideration of the actual charge/discharge history as in the case of the present embodiment of the invention, changes in the performance of the battery resulting from the charge/discharge history can be reflected in estimating the internal state of the secondary battery 1. That is, the post-correction diffusion coefficient $D_s$ is likely to coincide with the diffusion coefficient $D_s$ corresponding to the actual internal state of the secondary battery 1, and the internal state of the secondary battery 1 can be accurately estimated.

For example, the internal state of the secondary battery 1 can be estimated while specifying one of the voltage behaviors (indicated by the broken line and the solid line) shown in FIG. 2A, by setting the diffusion coefficient $D_s$ in consideration of the charge/discharge history in discharging the secondary battery 1. Besides, the internal state of the secondary battery 1 can be estimated while specifying one of the voltage behaviors (indicated by the broken line and the solid line) shown in FIG. 2B, by setting the diffusion coefficient $D_s$ in consideration of the charge/discharge history in charging the secondary battery 1.

Figure 14:
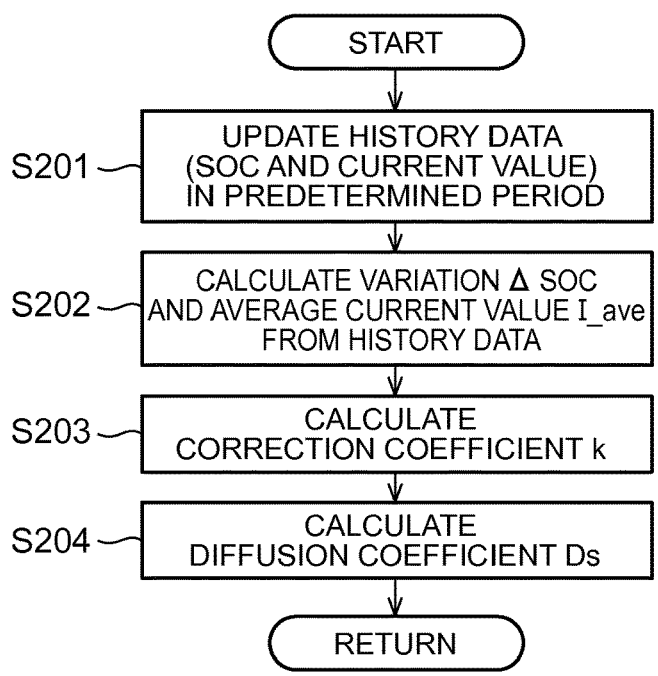
FIG. 14 is a flowchart showing a processing of calculating the diffusion coefficient in a first embodiment of the invention.

Next, a processing of calculating the diffusion coefficient Ds will be described using a flowchart shown in FIG. 14. The processing shown in FIG. 14 is executed by the controller 300.

In step S201, every time the SOC of the secondary battery 1 and the current value Ib are acquired, the controller 300 updates the history data (the SOC and the current value Ib) during the predetermined period Δt. Concretely, the controller 300 stores the newly acquired SOC and the newly acquired current value Ib into the memory 300a, and erases the history data (the SOC and the current value Ib) acquired in the most distant past from the memory 300a.

In step S202, the controller 300 calculates the variation ΔSOC and the average current value I_ave through the use of the history data stored in the memory 300a. In step S203, the controller 300 calculates the correction coefficient k corresponding to the variation ΔSOC and the average current value I_ave, which are calculated in the process of step S202, through the use of the corresponding relationship among the variation ΔSOC, the average current value I_ave, and the correction coefficient k.

In step S204, the controller 300 calculates the diffusion coefficient $D_s$ through the use of the aforementioned expression (31). It should be noted herein that the correction coefficient k calculated in the process of step S203 is used as the correction coefficient k. Besides, the diffusion coefficient (the reference value) $D_{s\_ini}$ can be calculated by detecting the battery temperature Tb and calculating the SOC of the secondary battery 1.

When the diffusion coefficient $D_s$ is calculated through the processing shown in FIG. 14, the processing shown in FIG. 11 is executed through the use of the newest diffusion coefficient $D_s$. Thus, the internal state of the secondary battery 1 can be accurately estimated as described above. If the internal state of the secondary battery 1 can be accurately estimated, the SOC of the secondary battery 1 can also be accurately estimated.

Second Embodiment

A battery system according to the second embodiment of the invention will be described. In the present embodiment of the invention, components identical to those described in the first embodiment of the invention are denoted by the same reference symbols respectively, and detailed description thereof will be omitted. The following description will focus mainly on what is different from the first embodiment of the invention.

Figure 15:
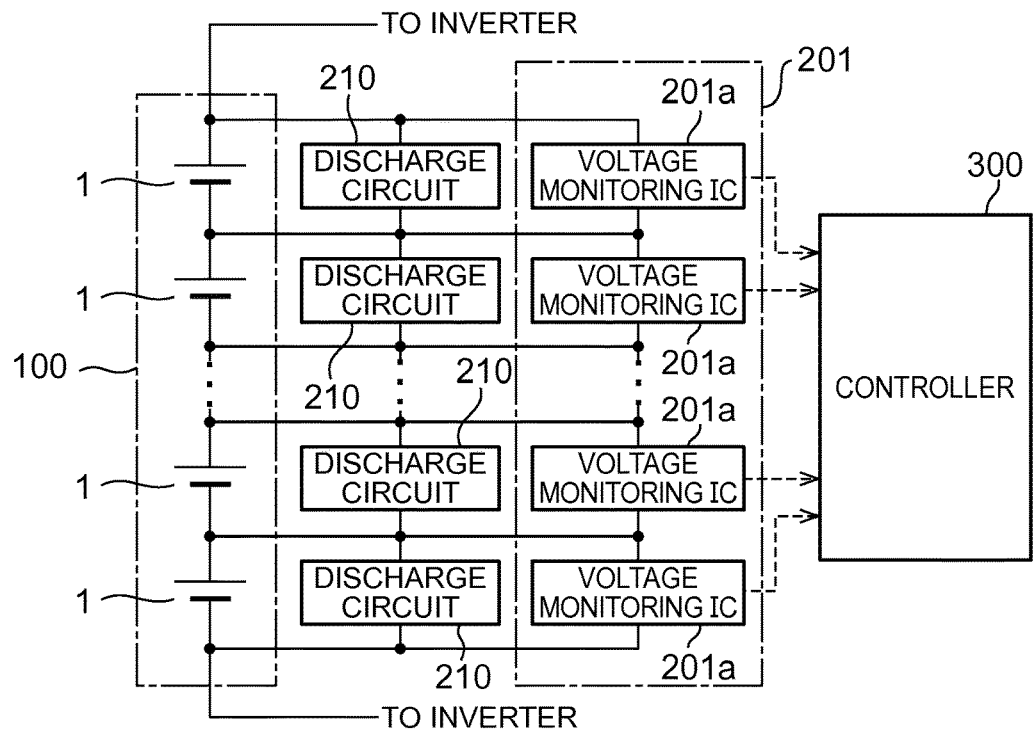
FIG. 15 is a view showing the configuration of monitoring units and discharge circuits.

As shown in FIG. 15, the monitoring unit 201 has voltage monitoring integrated circuits (IC's) 201a that are the same in number as the secondary batteries 1 constituting the assembled battery 100. The voltage monitoring IC's 201a are connected in parallel to the secondary batteries 1 respectively. Each of the voltage monitoring IC's 201a detects the voltage value Vb of a corresponding one of the secondary batteries 1, and outputs a detected result to the controller 300.

Besides, discharge circuits 210 are connected in parallel to the secondary batteries 1 respectively. The discharge circuits 210 are employed to restrain the voltage value (the OCV) or the state of charge (the SOC) from dispersing among the plurality of the secondary batteries 1. The operation of the discharge circuits 210 is controlled by the controller 300.

For example, when it is determined, based on the outputs of the voltage monitoring IC's 201a, that the voltage value (or the SOC) of a specific one of the secondary batteries 1 is higher than the voltage value (or the SOC) of the other secondary batteries 1, the controller 300 operates only the discharge circuit 210 corresponding to the specific one of the secondary batteries 1. Thus, only the specific one of the secondary batteries 1 can be discharged, and the voltage value of the specific one of the secondary batteries 1 can be made equal to the voltage value of the other secondary batteries 1. A processing of making the voltage values (or the SOC's) of the plurality of the secondary batteries 1 constituting the assembled battery 100 equal to one another through the use of the discharge circuits 210 is referred to as an equalization processing. In the equalization processing, either a single one of the secondary batteries 1 or a plurality of the secondary batteries 1 may be discharged.

Figure 16:
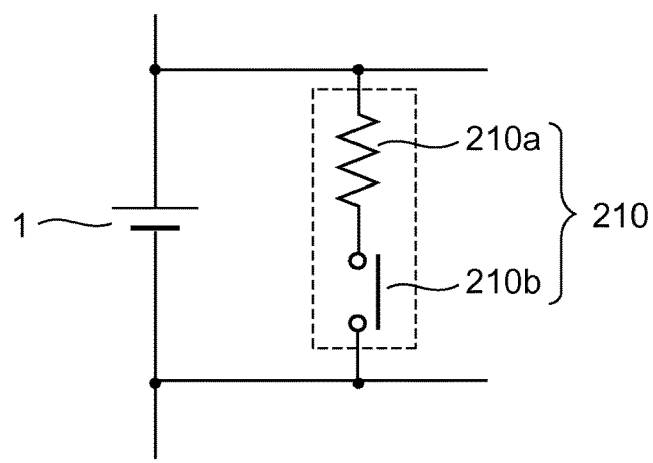
FIG. 16 is a view showing the configuration of each of the discharge circuits.

A concrete configuration (an example) of each of the discharge circuits 210 will be described using FIG. 16. FIG. 16 is a view showing the configurations of the secondary battery 1 and the discharge circuit 210.

The discharge circuit 210 has a resistance element 210a and a switch element 210b. Upon receiving a control signal from the controller 300, the switch element 210b turns on and off. When the switch element 210b turns on from its off state, a current flows from the secondary battery 1 to the resistance element 210a, thus making it possible to discharge the secondary battery 1.

The equalization processing can be executed when an ignition switch is off. When the ignition switch turns on after the equalization processing is executed while the ignition switch is off, a discharge history is produced in the secondary battery 1 subjected to the equalization processing. Therefore, as for the secondary battery 1 subjected to the equalization processing, the discharge history resulting from the equalization processing needs to be taken into account in calculating the diffusion coefficient $D_s$.

Thus, in the present embodiment of the invention, as for the secondary battery 1 subjected to the equalization processing, the diffusion coefficient $D_s$ is calculated in consideration of the discharge history resulting from the equalization processing. It should be noted herein that the secondary batteries 1 that are not subjected to the equalization processing are not discharged as a result of the equalization processing, so there is no need to take the discharge history into account. As for the secondary batteries 1 that are not subjected to the equalization processing, the diffusion coefficient $D_s$ at the time when the ignition switch turns on can be calculated through the use of the correction coefficient k at the time when the ignition switch turns off.

In the equalization processing, a specific one of the secondary batteries 1 is discharged. Therefore, a voltage value OCV_s after execution of the equalization processing is lower than a voltage value OCV_e before execution of the equalization processing. Therefore, a variation $\Delta$OCV in the voltage value OCV resulting from the equalization processing can be calculated. The variation $\Delta$OCV is calculated based on an expression (32) shown below.

[Mathematical Expression 20]

$$\Delta OCV = OCV\_s - OCV\_e \quad (32)$$

A predetermined corresponding relationship is established between the OCV and the SOC, so there is a corresponding relationship between the variation $\Delta$OCV and the variation $\Delta$SOC in the SOC. Therefore, if a corresponding relationship (a map or a function) between the variation $\Delta$OCV and the correction coefficient k is obtained in advance as in the case of the first embodiment of the invention, the correction coefficient k can be calculated by calculating the variation $\Delta$OCV. Information on the corresponding relationship between the variation $\Delta$OCV and the correction coefficient k can be stored into the memory 300a.

It should be noted herein that when the predetermined period $\Delta$t described in the first embodiment of the invention is equal to only a period in which the equalization processing is executed, the correction coefficient k can be calculated based on the variation $\Delta$OCV as described above. On the other hand, when the predetermined period $\Delta$t is longer than the period in which the equalization processing is executed, it may also be necessary to consider the charge/discharge history before the turning off of the ignition switch.

In this case, as described in the first embodiment of the invention, it is appropriate to calculate the correction coefficient k based on the variation $\Delta$SOC. It should be noted herein that the change in the SOC resulting from the equalization processing is also taken into account in calculating the variation $\Delta$SOC. Concretely, when the SOC after execution of the equalization processing is a minimum value during the predetermined period $\Delta$t, the variation $\Delta$SOC is calculated through the use of this SOC.

On the other hand, in calculating the correction coefficient k, the current value during execution of the equalization processing as well as the variation $\Delta$OCV can be taken into account. The current value at the time of the equalization processing is equivalent to the average current value I_ave described in the first embodiment of the invention. Therefore, if a corresponding relationship (a map or a function) among the variation $\Delta$OCV, the current value at the time of the equalization processing, and the correction coefficient k is obtained in advance in an experiment or the like as in the case of the first embodiment of the invention, the correction coefficient k can be calculated by specifying the variation $\Delta$OCV and the current value at the time of the equalization processing. It should be noted herein that information on the corresponding relationship among the variation $\Delta$OCV, the current value at the time of the equalization processing, and the correction coefficient k can be stored into the memory 300a.

It should be noted herein that when the resistance value of the resistance element 210a of the discharge circuit 210 is sufficiently larger than the resistance value (the internal resistance) of the secondary battery 1, the current value at the time of the equalization processing can be calculated based on the resistance value of the resistance element 210a and the variation $\Delta$OCV. Concretely, the current value at the time of the equalization processing can be calculated based on an expression (33) shown below.

[Mathematical Expression 21]

$$\Delta OCV = I \times R_{res} \quad (33)$$

In the aforementioned expression (33), I is a current value (a discharge current) at the time of the equalization processing, and $R_{res}$ is a resistance value of the resistance element 210a. When the resistance value $R_{res}$ is sufficiently larger than the resistance value of the secondary battery 1, the resistance value of a circuit including the resistance element 210a and the secondary battery 1 can be regarded as the resistance value $R_{res}$ of the resistance element 210a. Thus, the current value (the discharge current) I at the time of the equalization processing can be calculated based on the aforementioned expression (33).

When the predetermined period $\Delta$t is equal to only the period in which the equalization processing is executed, the correction coefficient k can be calculated based on the variation $\Delta$OCV and the current value I at the time of the equalization processing as described above. On the other hand, when the predetermined period $\Delta$t is longer than the period in which the equalization processing is executed, it may also be necessary to consider the charge/discharge history before the turning off of the ignition switch.

In this case, as described in the first embodiment of the invention, it is appropriate to calculate the correction coefficient k based on the variation $\Delta$SOC and the average current value I_ave. It should be noted herein that the current value I at the time of the equalization processing is also taken into account in calculating the average current value I_ave. Concretely, the average current value I_ave is calculated based on the current value I at the time of the equalization processing and the current value before the turning off of the ignition switch.

Figure 17:
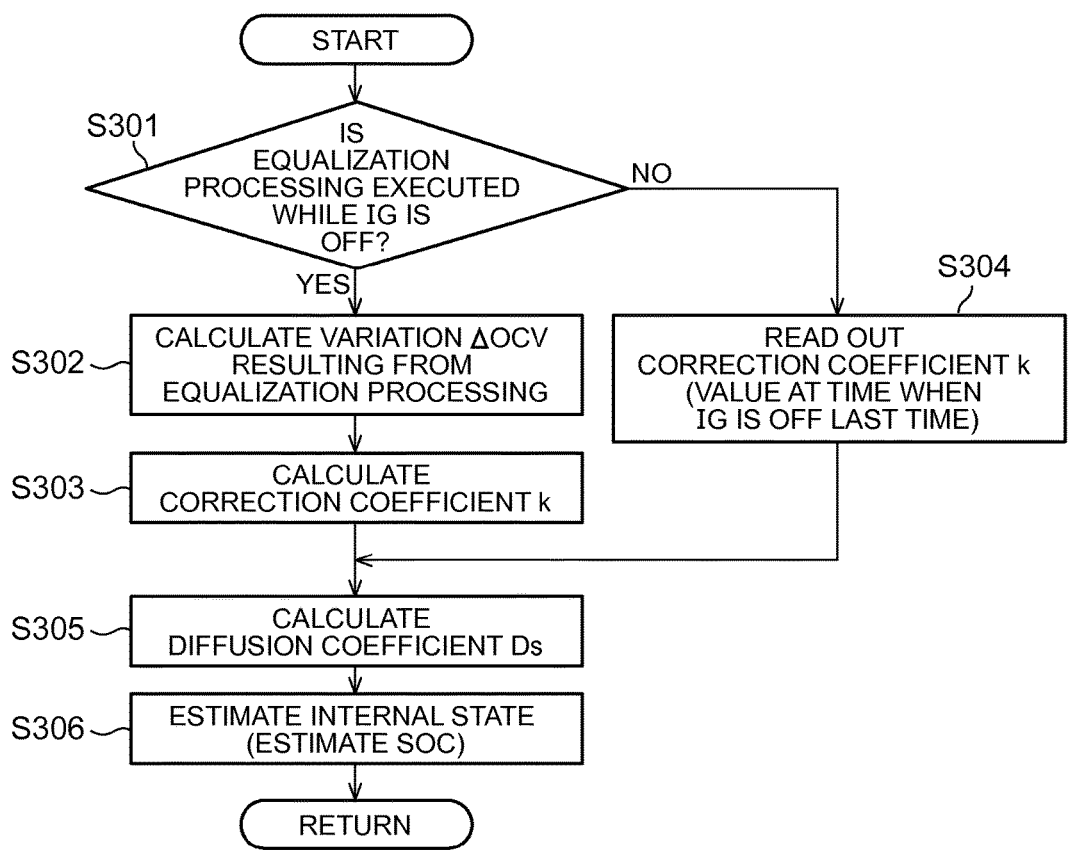
FIG. 17 is a flowchart showing a processing of estimating an internal state of a secondary battery in a second embodiment of the invention.

A processing of estimating the internal state of the secondary battery 1 in the present embodiment of the invention will be described using a flowchart shown in FIG. 17. The processing shown in FIG. 17 is started when the ignition switch turns on from its off state, and is executed by the controller 300. In the processing shown in FIG. 17, the predetermined period $\Delta$t is equal to only the period in which the equalization processing is executed.

In step S301, the controller 300 determines whether or not each of the secondary batteries 1 has been subjected to the equalization processing during an immediately preceding period in which the ignition switch is off. If the equalization processing is executed while the ignition switch is off, the controller 300 can set a flag indicating execution of the equalization processing. Information on the setting of this flag can be stored into the memory 300a. In the process of step S301, the controller 300 determines whether or not the equalization processing has been executed, by confirming the information on the setting of the flag.

Besides, when the equalization processing is executed, information on the secondary batteries 1 subjected to the equalization processing is stored into the memory 300a. The information on the secondary batteries 1 is information for specifying each of the plurality of the secondary batteries 1 constituting the assembled battery 100. Concretely, for example, identification numbers assigned to the respective secondary batteries 1 can be used as the information on the secondary batteries 1. By using the information on the secondary batteries 1, the controller 300 can specify each of the secondary batteries 1 subjected to the equalization processing.

When there is at least one secondary battery 1 subjected to the equalization processing, the controller 300 executes the process of step S302. In step S302, the controller 300 calculates the variation ΔOCV resulting from the equalization processing. As described above, the controller 300 calculates the variation ΔOCV based on the voltage value OCV_s before execution of the equalization processing and the voltage value OCV_e after execution of the equalization processing. Information on the voltage values OCV_s and OCV_e can be stored into the memory 300a when the equalization processing is executed.

In step S303, the controller 300 calculates the correction coefficient k based on the variation ΔOCV calculated in the process of step S302. Concretely, the controller 300 can calculate the correction coefficient k from the variation ΔOCV by using the corresponding relationship (the map or the function) between the variation ΔOCV and the correction coefficient k. It should be noted herein that the correction coefficient k can be calculated in consideration of the current value at the time of the equalization processing as well as the variation ΔOCV as described above.

On the other hand, as for the secondary batteries 1 that have not been subjected to the equalization processing, the controller 300 reads out the correction coefficient k in step S304. This correction coefficient k is the correction coefficient k that is calculated when the ignition switch is off, and is stored in the memory 300a. In the process of step S304, the controller 300 reads out the correction coefficient k stored in the memory 300a. Thus, the correction coefficient k regarding the secondary batteries 1 that have not been subjected to the equalization processing can be specified.

In step S305, the controller 300 calculates the diffusion coefficient $D_s$ through the use of the correction coefficient k specified in the process of step S303 or step S304. Concretely, the controller 300 calculates the diffusion coefficient $D_s$ by substituting the correction coefficient k and the diffusion coefficient $D_{s\_ini}$ that is calculated from the battery temperature Tb and the SOC of the secondary battery 1, for the corresponding variables in the aforementioned expression (31).

It should be noted herein that the diffusion coefficient $D_s$ is calculated through the use of the correction coefficient k calculated in the process of step S303, as to the secondary batteries 1 subjected to the equalization processing. Besides, the diffusion coefficient $D_s$ is calculated through the use of the correction coefficient k read out in the process of step S304, as to the secondary batteries 1 that have not been subjected to the equalization processing.

In step S306, the controller 300 estimates the internal state of each of the secondary batteries 1 based on the diffusion coefficient $D_s$ calculated in the process of step S305. It should be noted herein that the process of step S306 is identical to the process described in the first embodiment of the invention (FIG. 11). It should be noted, however, that the diffusion coefficient $D_s$ in estimating the internal state may differ depending on whether or not the secondary batteries 1 are subjected to the equalization processing.

Incidentally, when the predetermined period Δt also includes the period before the turning off of the ignition switch, it is appropriate to calculate the correction coefficient k based on the charge/discharge history before the turning off of the ignition switch and the discharge history at the time of execution of the equalization processing, as described above. Then, the diffusion coefficient $D_s$ is calculated through the use of the calculated correction coefficient k, so the internal state of the secondary battery 1 can be estimated.

According to the present embodiment of the invention, the diffusion coefficient $D_s$ of each of the secondary batteries 1 can be specified in consideration of the equalization processing that is executed while the ignition switch is off. Thus, the internal state of the secondary battery 1 can be accurately estimated in consideration of the discharge history resulting from the equalization processing as well. Besides, if the internal state of the secondary battery 1 can be accurately estimated, the SOC of the secondary battery 1 can also be accurately estimated.

Third Embodiment

The third embodiment of the invention will be described. In the present embodiment of the invention, components identical to those described in the first embodiment of the invention are denoted by the same reference symbols respectively, and detailed description thereof will be omitted.

As described in the first embodiment of the invention, with the secondary battery 1 that employs the two-phase coexistence type positive electrode active material, the resistance value (the diffusion resistance in particular) changes in accordance with the charge/discharge history. Therefore, the resistance value of the secondary battery 1 can be corrected based on an expression (34) shown below.

[Mathematical Expression 22]

$$R = R_{ini} \times k' \qquad (34)$$

In the aforementioned expression (34), $R_{ini}$ is a resistance value (a reference value) that is specified in advance through an experiment or the like in a state where the influence of the charge/discharge history is negligible. The deterioration in the secondary battery 1 progresses with the lapse of time. Therefore, the resistance value $R_{ini}$ can be set in consideration of the period of use of the secondary battery 1. This period of use is a period from the time of first use of the secondary battery 1 to the present.

If a corresponding relationship (a map or a function) between the resistance value $R_{ini}$ and the period of use is obtained in advance through an experiment or the like, the resistance value $R_{ini}$ can be calculated by specifying the period of use. The period of use can be measured through the use of, for example, a timer. Besides, information on the corresponding relationship between the resistance value $R_{ini}$ and the period of use can be stored into the memory 300a.

On the other hand, the resistance value Rini depends on the temperature Tb and the SOC of the secondary battery 1. Therefore, a corresponding relationship (a map or a function) between at least one of the battery temperature Tb and the SOC and the resistance value $R_{ini}$ can be obtained in advance through an experiment or the like. Information on this corresponding relationship can be stored into the memory 300a. It should be noted herein that the resistance value $R_{ini}$ can be calculated by detecting the battery temperature Tb and estimating the SOC.

In the aforementioned expression (34), k' is a correction coefficient. The correction coefficient k' is used to correct the resistance value $R_{ini}$ in consideration of the influence of the charge/discharge history of the secondary battery 1. As in the case of the first embodiment of the invention, the correction coefficient k' is set in accordance with the parameters specifying the charge/discharge history. These parameters include the variation ΔSOC and the average current value I_ave described in the first embodiment of the invention.

If a corresponding relationship (a map or a function) between at least one of the variation ΔSOC and the average current value I_ave and the correction coefficient k' is obtained in advance through an experiment or the like, the correction coefficient k' can be calculated by specifying the variation ΔSOC and the average current value I_ave. It should be noted herein that the method of calculating the variation ΔSOC and the average current value I_ave is identical to the method described in the first embodiment of the invention.

The processing of calculating the resistance value R of the secondary battery 1 can be executed by the controller 300. It should be noted herein that the controller 300 calculates the resistance value $R_{ini}$ by acquiring at least one of the period of use, the battery temperature Tb, and the SOC. Besides, the controller 300 calculates the correction coefficient k' by acquiring the history data (the variation ΔSOC and the average current value I_ave). If the resistance value $R_{ini}$ and the correction coefficient k' are calculated, the controller 300 can calculate the resistance value R based on the aforementioned expression (34).

In the present embodiment of the invention, the influence of the charge/discharge history can be reflected by the resistance value R of the secondary battery 1. In this manner, if the charge/discharge history is taken into account, the resistance value R can be accurately estimated in the secondary battery 1 including the two-phase coexistence type positive electrode active material.

The invention claimed is:

1. A battery system comprising:
   a lithium-ion secondary battery that employs a two-phase coexistence type positive electrode active material; and
   a controller that:
      calculates a distribution of concentration of lithium in an active material in the lithium-ion secondary battery based on a diffusion coefficient and a boundary condition,
      calculates an average concentration of lithium in the active material based on the calculated distribution of concentration of lithium, and
      calculates a state of charge (SOC) corresponding to the calculated average concentration based on a corresponding relationship between the average concentration and an SOC of the lithium-ion secondary battery, wherein
   the controller corrects the diffusion coefficient in accordance with history data indicating a charge/discharge state of the lithium-ion secondary battery in a predetermined period to a present time, by multiplying a reference value of the diffusion coefficient by a correction coefficient corresponding to the history data, and
   wherein the history data is updated every time the lithium-ion secondary battery is charged or discharged.

2. The battery system according to claim 1, wherein
   the controller calculates the correction coefficient corresponding to the present history data in the lithium-ion secondary battery based on a corresponding relationship between the history data and the correction coefficient.

3. The battery system according to claim 1, further comprising:
   a memory in which the history data are stored.

4. The battery system according to claim 1, wherein
   the history data include at least one of a variation in a state of charge (SOC) of the lithium-ion secondary battery in the predetermined period to a present time, and an average current value of the lithium-ion secondary battery in the predetermined period.

5. The battery system according to claim 4, wherein
   the variation in the SOC is a difference between a maximum value of the SOC in the predetermined period and a minimum value of the SOC in the predetermined period.

6. The battery system according to claim 1, further comprising:
   a temperature sensor that detects a temperature of the lithium-ion secondary battery, wherein
   the controller calculates the reference value corresponding to the detected temperature of the temperature sensor based on a corresponding relationship between the temperature of the lithium-ion secondary battery and the reference value.

7. The battery system according to claim 1, wherein
   the controller calculates the reference value corresponding to a present state of charge (SOC) of the lithium-ion secondary battery based on a corresponding relationship between the SOC of the lithium-ion secondary battery and the reference value.

8. The battery system according to claim 1, further comprising:
   a plurality of discharge circuits being connected in series to one another, and a plurality of the lithium-ion secondary batteries being connected in series to one another, wherein
   the plurality of discharge circuits are connected in parallel to the plurality of lithium-ion secondary batteries, respectively, to discharge the respective lithium-ion secondary batteries, and
   the history data include voltage variations at a time when the lithium-ion secondary batteries are discharged by the discharge circuits respectively.

9. The battery system according to claim 1, wherein
   the lithium-ion secondary battery outputs an electric power that is converted into kinetic energy to cause a vehicle to run.

* * * * *